United States Patent
Shibayama et al.

(10) Patent No.: US 9,048,814 B2
(45) Date of Patent: Jun. 2, 2015

(54) RESISTANCE ADJUSTING CIRCUIT AND RESISTANCE ADJUSTING METHOD

(71) Applicants: FUJITSU LIMITED, Kawasaki-shi, Kanagawa (JP); FUJITSU SEMICONDUCTOR LIMITED, Yokohama-shi, Kanagawa (JP)

(72) Inventors: Naoya Shibayama, Kawasaki (JP); Masatoshi Yoshida, Taiwa (JP)

(73) Assignees: FJUITSU LIMITED, Kawasaki (JP); SOCIONEXT INC., Yokohama (JP)

( * ) Notice: Subject to any disclaimer, the term of this patent is extended or adjusted under 35 U.S.C. 154(b) by 0 days.

(21) Appl. No.: 14/282,260

(22) Filed: May 20, 2014

(65) Prior Publication Data

US 2014/0347141 A1 Nov. 27, 2014

(30) Foreign Application Priority Data

May 22, 2013 (JP) .................. 2013-108270

(51) Int. Cl.
*H03K 17/16* (2006.01)
*H03K 19/003* (2006.01)
*H03K 19/00* (2006.01)
*H04L 25/02* (2006.01)
*H03H 7/38* (2006.01)
*G06F 13/40* (2006.01)
(Continued)

(52) U.S. Cl.
CPC .............. *H03H 7/38* (2013.01); *G06F 13/4086* (2013.01); *H03K 19/0005* (2013.01); *H03K 19/017545* (2013.01); *H03K 19/018521* (2013.01); *H04L 25/0278* (2013.01); *H04L 25/0298* (2013.01)

(58) Field of Classification Search
CPC ........... H04L 25/0278; H04L 25/0298; H03K 19/0005
USPC ..................... 326/30; 327/108, 109
See application file for complete search history.

(56) References Cited

U.S. PATENT DOCUMENTS 6,418,500 B1 7/2002 Gai et al.
7,321,613 B2 1/2008 Renaud et al.
(Continued)

FOREIGN PATENT DOCUMENTS

JP 2000-134082 5/2000
JP 2004-194304 7/2004

OTHER PUBLICATIONS

Extended European Search Report dated Nov. 24, 2014 in corresponding European Patent Application No. 14169257.4.
(Continued)

*Primary Examiner* — Dylan White
(74) *Attorney, Agent, or Firm* — Staas & Halsey LLP

(57) ABSTRACT

A resistance adjusting circuit including, a reference resistor, a first power source configured to output a first voltage, a first current source configured to output a first current based on a reference current set by using the reference resistor, a first variable resistor, a second current source configured to output a second current obtained by multiplying the first current by a reciprocal ratio, the reciprocal ratio being obtained as a reciprocal number of a ratio of a target resistance of the first variable resistor to a resistance of the reference resistor, and a controller configured to set a resistance of the first variable resistor so that a voltage at a second terminal of the reference resistor and a voltage at a connecting part of the first variable resistor and the second current source become equal to each other.

14 Claims, 14 Drawing Sheets

(51) Int. Cl.
  *H03K 19/0175* (2006.01)
  *H03K 19/0185* (2006.01)

(56) References Cited

U.S. PATENT DOCUMENTS

| | | |
|---|---|---|
| 2004/0108881 A1 | 6/2004 | Bokui et al. |
| 2005/0052200 A1 | 3/2005 | Nguyen et al. |
| 2005/0134303 A1* | 6/2005 | Best et al. ............. 326/30 |
| 2009/0206886 A1* | 8/2009 | Chang et al. ............ 327/108 |

OTHER PUBLICATIONS

Patent Abstracts of Japan, Publication No. 2000-134082, Published May 12, 2000.
Patent Abstracts of Japan, Publication No. 2004-194304, Published Jul. 8, 2004.

* cited by examiner

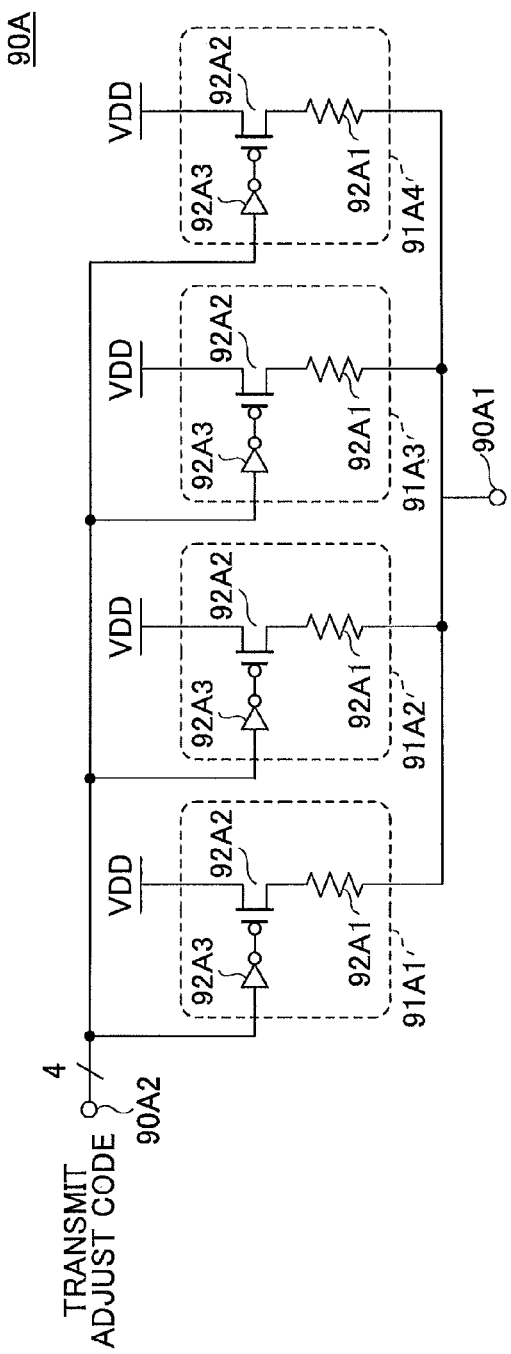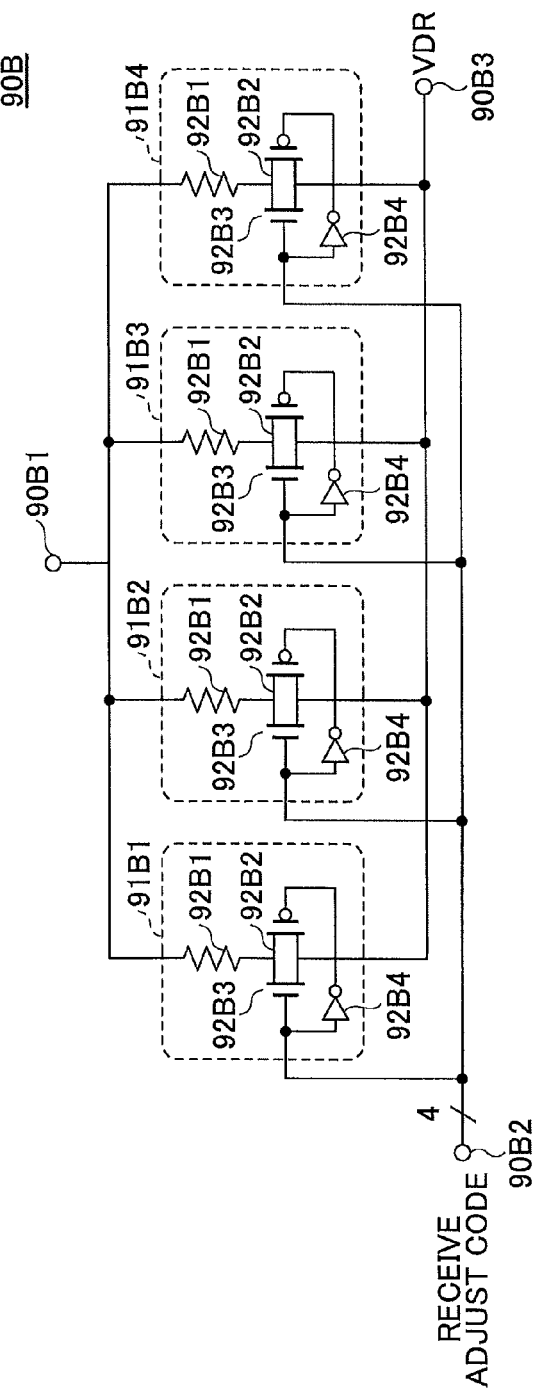

RESISTANCE ADJUSTING CIRCUIT AND RESISTANCE ADJUSTING METHOD

CROSS-REFERENCE TO RELATED APPLICATIONS

This patent application is based upon and claims the benefit of priority of the prior Japanese Patent Application No. 2013-108270 filed on May 22, 2013, the entire contents of which are incorporated herein by reference.

FIELD

The disclosures discussed herein relate to a resistance adjusting circuit and a resistance adjusting method.

BACKGROUND

There has been a semiconductor integrated circuit apparatus in which current adjusting Metal Oxide Semiconductor Field Effect Transistors (MOSFETs) are attached to output circuits, respectively, that have Low Voltage Differential Signal (LVDS) configurations. In the semiconductor integrated circuit apparatus, one of the output circuits is used as a dummy output circuit and a termination resistor is connected to an output terminal of the dummy output circuit. A control signal of the current adjusting MOSFET connected to the dummy output circuit is generated by comparing high level and low level output from the output terminal and reference high level and low level, respectively, so that output level of the dummy output circuit become designated output levels. In the semiconductor integrated circuit apparatus, the control signal is supplied to the rest of the current adjusting MOSFETs of the output circuits in order to control currents of the output circuits automatically (for example, see patent document 1).

Moreover, there has been a parameter correcting circuit embedded in a semiconductor integrated circuit. According to the parameter correcting circuit, the semiconductor integrated circuit includes a current supply circuit, a variable parameter, a plurality of switch circuits, a voltage detect circuit and an adjusting circuit which adjusts a parameter value of the variable parameter. A reference parameter is connected to one of the switch circuits of which the parameter value has been known in advance, and the switch circuits switch electrical connection among the current supply circuit, the reference parameter, the variable parameter and the voltage detect circuit. The voltage detect circuit detects voltages of the reference parameter and the variable parameter in a case where currents are supplied from the current supply circuit to the reference parameter and the variable parameter, respectively. The adjusting circuit adjusts the variable parameter and the parameter value based on the voltages of the reference parameter and the variable parameter detected by the voltage detect circuit (for example, see patent document 2).

However, the conventional semiconductor integrated circuit apparatus does not include adjusting equipment which adjusts a termination resistor at a receive (Rx) side.

Moreover, in the parameter correcting circuit, a first terminal of a variable resistor element is connected to a mirror circuit, and a second terminal of the variable resistor element is grounded. Since the variable resistor element is grounded as described above, it is difficult to adjust a resistance value of the variable resistor element at a receiving circuit side of a transceiver circuit in a case where an arbitrary termination voltage which is different from a power source voltage of the transmitting circuit is supplied to the variable resistor element. In the transceiver circuit, a transmitting circuit and the receiving circuit are coupled in an alternating current coupling configuration.

PRIOR ART REFERENCES

Patent References

[Patent Reference 1]: Japanese Laid-open Patent Publication No. 2000-134082

[Patent Reference 2]: Japanese National Publication of International Patent Application No. 2004-194304

SUMMARY

Accordingly, it is an object in one aspect of the invention to provide a resistance adjusting circuit and a resistance adjusting method that can adjust resistance value in accordance with an arbitrary termination voltage at a receive (Rx) side.

According to an aspect of an embodiment, there is provided a resistance adjusting circuit including, a reference resistor, a first power source connected to a first terminal of the reference resistor and configured to output a first voltage, a first current source connected to a second terminal of the reference resistor and configured to output a first current based on a reference current which is set by using the reference resistor, a first variable resistor configured to include a first terminal, the first terminal being connected to an output terminal of the first power source, a second current source connected to a second terminal of the first variable resistor and configured to output a second current obtained by multiplying the first current by a reciprocal ratio, the reciprocal ratio being obtained as a reciprocal number of a ratio of a target resistance value of the first variable resistor to a resistance value of the reference resistor, and a controller configured to set the resistance value of the first variable resistor so that a voltage value at the second terminal of the reference resistor and a voltage value at a connecting part of the first variable resistor and the second current source become equal to each other.

In another aspect, there is provided a resistance adjusting circuit including, a reference resistor, a first selector configured to include a first input terminal, a second input terminal and an output terminal and to select the first input terminal or the second input terminal, the output terminal being connected to the first terminal of the reference resistor, a second selector configured to include a first input terminal, a second input terminal and an output terminal and to select the first input terminal or the second input terminal, the output terminal being connected to the second terminal of the reference resistor and the first input terminal being connected to a reference potential point, a reference current output circuit configured to include an output terminal connected to the first input terminal of the first selector and to output the reference current, a first power source configured to include an output terminal connected to the second input terminal of the first selector and to output a first voltage, a first current source connected to the second input terminal of the second selector and configured to output a first current based on the reference current, a variable resistor configured to include a first terminal connected to the output terminal of the first power source, a second current source connected to a second terminal of the variable resistor and configured to output a second current, the second current being obtained by multiplying the first current by a reciprocal ratio, the reciprocal ratio being obtained as a reciprocal number of a ratio of a target resistance value of the variable resistor to a resistance value of the reference resistor, and a controller, wherein, when setting the reference current, the controller adjusts the reference current of the reference current output circuit so that a voltage value at a first terminal of the reference resistor and a target voltage value at the first terminal of the reference resistor become equal to each other, in a state where the controller causes the first selector to select the first input terminal and causes the second selector to select the first input terminal, and wherein, after setting the reference current, the controller adjusts a resistance value of the variable resistor so that a voltage value at the second terminal of the reference resistor and a voltage value at a connecting part of the variable resistor and the second current source become equal to each other, in a state where the controller causes the first selector to select the second input terminal and causes the second selector to select the second input terminal.

In another aspect, there is provided a resistance adjusting method including, using a resistance adjusting circuit including, a reference resistor, a first selector configured to include a first input terminal, a second input terminal and an output terminal and to select the first input terminal or the second input terminal, the output terminal being connected to the first terminal of the reference resistor, a second selector configured to include a first input terminal, a second input terminal and an output terminal and to select the first input terminal or the second input terminal, the output terminal being connected to the second terminal of the reference resistor and the first input terminal being connected to a reference potential point, a reference current output circuit configured to include an output terminal connected to the first input terminal of the first selector and to output the reference current, a first power source configured to include an output terminal connected to the second input terminal of the first selector and to output a first voltage, a first current source connected to the second input terminal of the second selector and configured to output a first current based on the reference current, a variable resistor configured to include a first terminal connected to the output terminal of the first power source, and a second current source connected to a second terminal of the variable resistor and configured to output a second current, the second current being obtained by multiplying the first current by a reciprocal ratio, the reciprocal ratio being obtained as a reciprocal number of a ratio of a target resistance value of the variable resistor to a resistance value of the reference resistor, adjusting, when setting the reference current, the reference current of the reference current output circuit so that a voltage value at a first terminal of the reference resistor and a target voltage value at the first terminal of the reference resistor become equal to each other, in a state where the first selector selects the first input terminal and the second selector selects the first input terminal, and adjusting, after setting the reference current, a resistance value of the variable resistor so that a voltage value at a second terminal of the reference resistor and a voltage value at a connecting part of the variable resistor and the second current source become equal to each other, in a state where the first selector selects the second input terminal and the second selector selects the second input terminal.

In another aspect, there is provided a resistance adjusting method including, using a resistance adjusting circuit including, a reference resistor, a first selector configured to include a first input terminal, a second input terminal and an output terminal and to select the first input terminal or the second input terminal, the output terminal being connected to the first terminal of the reference resistor, a second selector configured to include a first input terminal, a second input terminal and an output terminal and to select the first input terminal or the second input terminal, the output terminal being connected to the second terminal of the reference resistor and the first input terminal being connected to a reference potential point, a reference current output circuit configured to include an output terminal connected to the first input terminal of the first selector and to output the reference current, a first power source configured to include an output terminal connected to the second input terminal of the second selector and to output a first voltage, a first current source connected to the second input terminal of the first selector and configured to output a first current based on the reference current, a variable resistor configured to include a first terminal connected to the output terminal of the first power source, and a second current source connected to a second terminal of the variable resistor and configured to output a second current, the second current being obtained by multiplying the first current by a reciprocal ratio, the reciprocal ratio being obtained as a reciprocal number of a ratio of a target resistance value of the variable resistor to a resistance value of the reference resistor, adjusting, when setting the reference current, the reference current of the reference current output circuit so that a voltage value at a first terminal of the reference resistor and a target voltage value at the first terminal of the reference resistor become equal to each other, in a state where the first selector selects the first input terminal and the second selector selects the first input terminal, and adjusting, after setting the reference current, a resistance value of the variable resistor so that a voltage value at a first terminal of the reference resistor and a voltage value at a connecting part of the variable resistor and the second current source become equal to each other, in a state where the first selector selects the second input terminal and the second selector selects the second input terminal.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

BRIEF DESCRIPTION OF THE DRAWINGS

FIG. 3A is a diagram illustrating circuit configurations of termination resistors according to the first embodiment;

FIG. 3B is a diagram illustrating circuit configurations of termination resistors according to the first embodiment;

DESCRIPTION OF EMBODIMENTS

A description is given, with reference to the accompanying drawings, of embodiments of a resistance adjusting circuit and a resistance adjusting method.

<First Embodiment>

Figure 1:
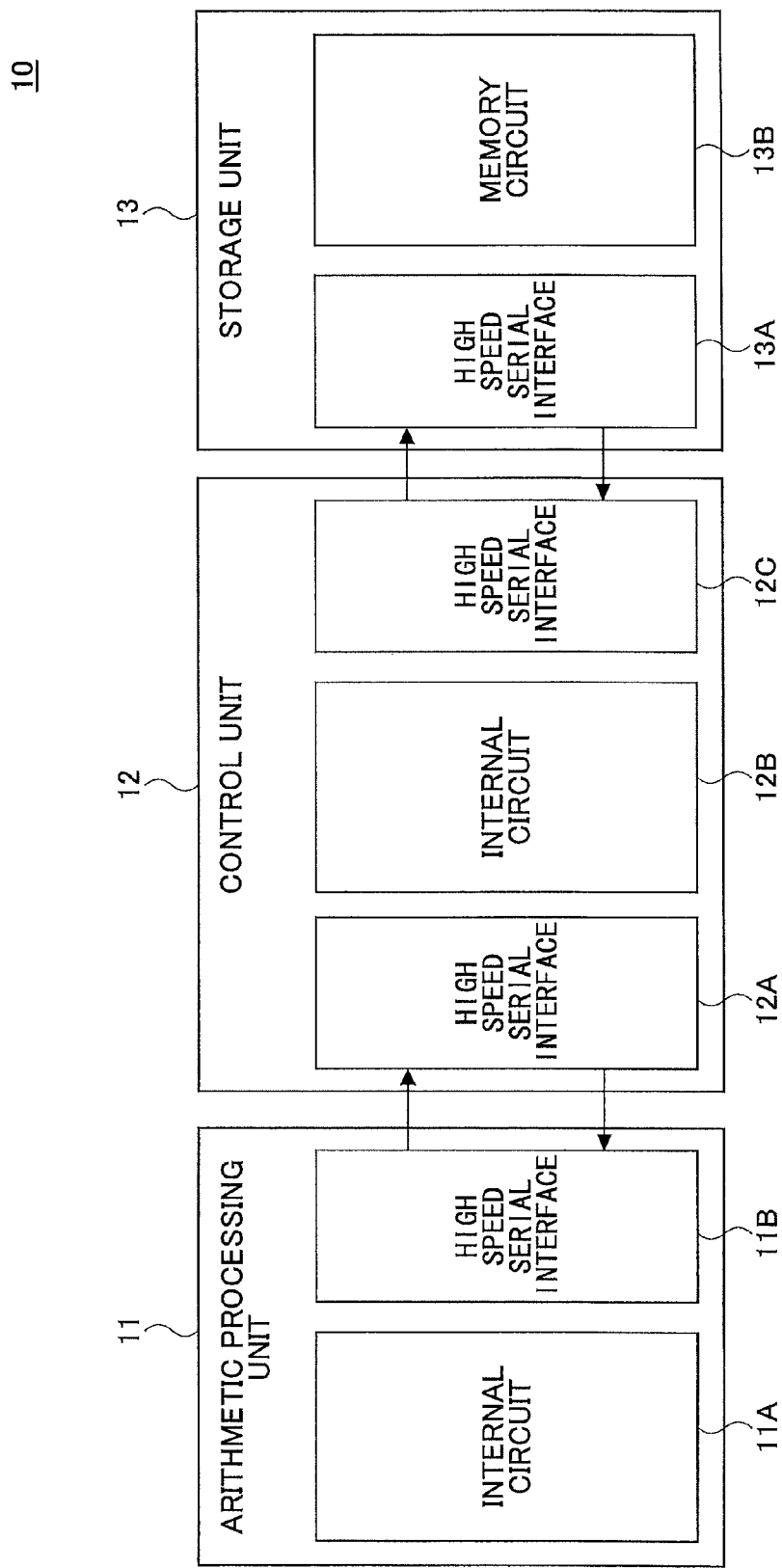
FIG. 1 is a diagram illustrating a server including a resistance adjusting circuit according to a first embodiment.

FIG. 1 is a diagram illustrating a server 10 including a resistance adjusting circuit according to the first embodiment.

The server 10 having the resistance adjusting circuit according to the first embodiment includes an arithmetic processing unit 11, control unit 12 and a storage unit 13. The arithmetic processing unit 11, control unit 12 and the storage unit 13 are realized by Large Scale Integrated circuits (LSIs), respectively, for example.

The arithmetic processing unit 11 is a Central Processing Unit (CPU), for example. The arithmetic processing unit 11 includes an internal circuit 11A and a high speed serial interface 11B. The internal circuit 11A is a processor such as a multicore processor, for example, and performs designated arithmetic processing by executing a program.

The control unit 12 is a chip set including a memory controller, a crossbar or the like, for example. The control unit 12 includes a high speed serial interface 12A, an internal circuit 12B and a high speed serial interface 12C. The internal circuit 12B is a controller of the chip set, for example.

The storage unit 13 includes a high speed serial interface 13A and a memory circuit 13B. The memory circuit 13B is a hard disk drive, for example.

The internal circuits 11A and 12B and the memory circuit 13B transfer data via the high speed serial interfaces 11B, 12A, 12C and 13A. The high speed serial interfaces 11B, 12A, 12C and 13A are used for realizing data transfer at a high speed and a large capacity, and are referred to as a Serializer/Deserializer (Serdes).

The resistance adjusting circuit of the first embodiment is included in the high speed serial interfaces 11B, 12A, 12C and 13A, for example.

The high speed serial interfaces 11B, 12A, 12C and 13A are constituted by a high speed digital circuit and a high speed/high precision Complementary Metal Oxide Semiconductor (CMOS) analog circuit.

The CMOS analog circuit includes an adjusting equipment which adjusts a variation of a transistor or a resistor having occurred in a manufacturing process based on a reference resistor disposed outside of an LSI chip and a reference voltage which is supplied from outside of the LSI chip, for the sake of obtaining designated performance and designated characteristics of the circuit.

In particular, the high speed serial interfaces 11B, 12A, 12C and 13A include a reference current which is used as an operational reference of an analog circuit, a termination resistor at a transmit (Tx) side and an adjusting circuit which adjusts a resistance value of a termination resistor at a receive (Rx) side. Hereinafter, the transmit (Tx) side is referred to as a Tx side, and receive (Rx) side is referred to as Rx side.

One adjusting circuit is disposed in one LSI chip or one high speed serial interface circuit.

Although the resistance adjusting circuit is included in the server 10 according to the first embodiment, the resistance adjusting circuit may be included in a Personal Computer (PC) in a similar manner.

Figure 2:
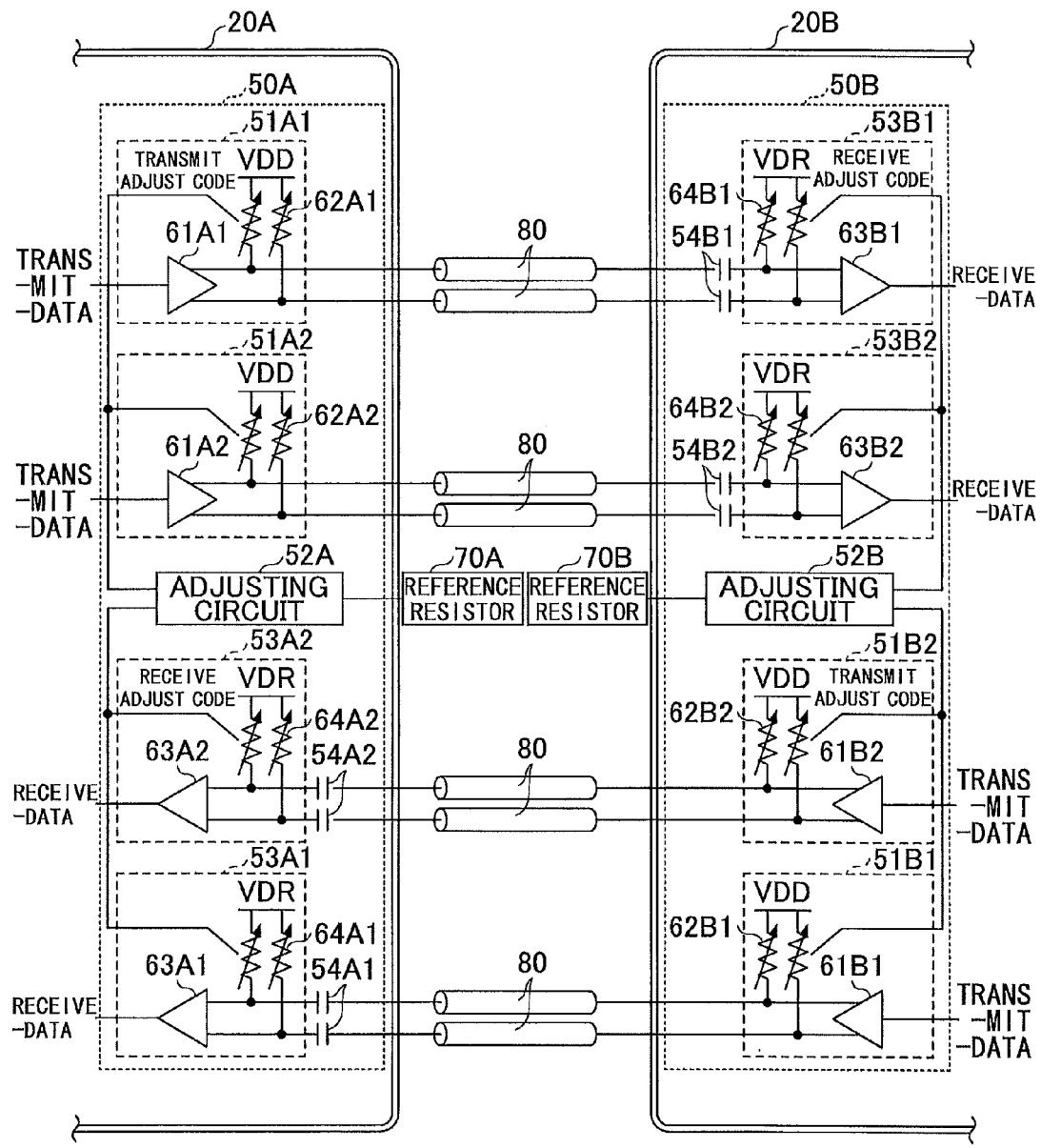
FIG. 2 is a diagram illustrating a boundary portion between LSIs including the resistance adjusting circuit according to the first embodiment.

FIG. 2 is a diagram illustrating a boundary portion between LSIs 20A and 20B including the resistance adjusting circuit according to the first embodiment. The LSIs 20A and 20B correspond to the arithmetic processing unit 11 and the control unit 12 or the control unit 12 and the storage unit 13 as illustrated in FIG. 1, for example.

The LSIs 20A and 20B include high speed serial interfaces 50A and 50B, respectively. The high speed serial interfaces 50A and 50B correspond to the high speed serial interfaces 11B and 12A or the high speed serial interfaces 12C and 13A as illustrated in FIG. 1, for example.

Herein, as an example, an embodiment in which the LSIs 20A and 20B correspond to the arithmetic processing unit 11 and the control unit 12 or the control unit 12 and the storage unit 13, and the high speed serial interfaces 50A and 50B correspond to the high speed serial interfaces 11B and 12A or the high speed serial interfaces 12C and 13A will be described.

Herein, the LSIs 20A and 20B are independent LSIs that transfer data with each other. Accordingly, the LSIs 20A and 20B are not limited to the arithmetic processing unit 11 and the control unit 12 or the control unit 12 and the storage unit 13 as illustrated in FIG. 1.

The high speed serial interfaces 50A and 50B are not limited to the high speed serial interfaces 11B and 12A or the high speed serial interfaces 12C and 13A. The high speed serial interfaces 50A and 50B may be interfaces that are included in independent LSIs, respectively, and transmit and receive data between the LSIs.

The high speed serial interfaces 50A and 50B are connected by transmission lines 80. The transmission lines 80 are buses disposed on a Printed Circuit Board (PCB) on which the LSIs 20A and 20B are mounted or buses disposed in a package in which the LSIs 20A and 20B are included, for example.

The high speed serial interface 50A includes drivers 51A1 and 51A2, an adjusting circuit 52A, receivers 53A1 and 53A2 and capacitors 54A1 and 54A2.

Similarly, the high speed serial interface 50B includes drivers 51B1 and 51B2, an adjusting circuit 52B, receivers 53B1 and 53B2 and capacitors 54B1 and 54B2.

The resistance adjusting circuits according to the first embodiment are included in the adjusting circuits 52A and 52B, respectively.

Since the high speed serial interfaces 50A and 50B have configurations that are similar to each other, the configuration of the high speed serial interface 50A will be described hereinafter.

The driver 51A1 includes a buffer 61A1 and termination resistors 62A1.

Transmit-data is input to the buffer 61A1 from a processing part included in the LSI 20A. The transmit-data is data which is transmitted from the LSI 20A to the LSI 20B. The buffer 61A1 transfers the transmit-data into differential transmit-data and transmits the differential transmit-data to the receiver 53B1 of the high speed serial interface 50B via two of the transmission lines 80.

The termination resistors 62A1 are constituted of a pair of variable resistors. First ends of the termination resistors 62A1 are connected to connecting points between output terminals of the buffer 61A1 and the two paired transmission lines 80, respectively, and second ends of the termination resistors 62A1 are connected to a power source VDD. Resistance values of the termination resistors 62A1 are adjusted in accordance with a transmit adjust code input from the adjusting circuit 52A, and characteristic impedances of transmission lines between the buffer 61A1 and the transmission lines 80 are set to target values. Typically, the target value of the characteristic impedance is 50 Ω.

The driver 51A2 includes a buffer 61A2 and termination resistors 62A2.

Transmit-data is input to the buffer 61A2 from the processing part included in the LSI 20A. The transmit-data is data which is transmitted from the LSI 20A to the LSI 20B. The buffer 61A2 transfers the transmit-data into differential transmit-data and transmits the differential transmit-data to the receiver 53B2 of the high speed serial interface 50B via two of the transmission lines 80.

The termination resistors 62A2 are constituted of a pair of variable resistors. First ends of the termination resistors 62A2 are connected to connecting points between output terminals of the buffer 61A2 and the transmission lines 80, respectively, and second ends of the termination resistors 62A2 are connected to the power source VDD. Resistance values of the termination resistors 62A2 are adjusted in accordance with a transmit adjust code input from the adjusting circuit 52A, and characteristic impedances of transmission lines between the buffer 61A2 and two of the transmission lines 80 are set to target values. Typically, the target value of the characteristic impedance is 50 Ω.

The adjusting circuit 52A includes the resistance adjusting circuit of the first embodiment and outputs the transmit adjust code and a receive adjust code. The transmit adjust code is used for adjusting the resistance values of the termination resistors 62A1 and 62A2. The receive adjust code is used for adjusting the resistance values of the termination resistors 64A1 and 64A2. Since the resistance values of the termination resistors 62A1 and 62A2 and the resistance values of the termination resistors 64A1 and 64A2 may be different from each other, the adjusting circuit 52A inputs the transmit adjust code to the termination resistors 62A1 and 62A2 and inputs the receive adjust code to the termination resistors 64A1 and 64A2, independently.

A reference resistor 70A is connected to the adjusting circuit 52A. The resistance adjusting circuit of the first embodiment is connected to the reference resistor 70A. Details of the resistance adjusting circuit of the first embodiment will be described later.

The receiver 53A1 includes a receiving circuit 63A1 and termination resistors 64A1.

A pair of input terminals of the receiving circuit 63A1 is connected to two of the transmission lines 80 via a pair of capacitors 54A1.

The receiving circuit 63A1 receives receive-data from the driver 51B1 of the LSI 20B via the capacitors 54A1 and the transmission lines 80. The receive-data is data which is transmitted from the LSI 20B to LSI 20A. The receiving circuit 63A1 transfers the differential receive-data into single-end receive-data and transfers the single-end receive data to the processing part of the LSI 20A.

For the sake of coupling the receiver 53A1 and the transmission lines 80 in an alternating current coupling configuration, the receiver 53A1 is connected to the transmission lines 80 via the capacitors 54A1. Accordingly, the receiver 53A1 and the driver 51B1 are coupled in an alternating current coupling configuration. The receiver 53A1 only receives an alternating current component of the transmit-data from the driver 51B1.

The receive-data which is received by the receiver 53A1 from the driver 51B1 is superimposed on a designated direct current voltage at the termination resistors 64A1.

The termination resistors 64A1 are constituted of a pair of variable resistors. First ends of the termination resistors 64A1 are connected to connecting points between input terminals of the receiving circuit 63A1 and two the capacitors 54A1, respectively, and second ends of the termination resistors 64A1 are connected to a power source VDR. Resistance values of the termination resistors 64A1 are adjusted in accordance with a receive adjust code input from the adjusting circuit 52A, and characteristic impedances of transmission lines between the receiving circuit 63A1 and two of the transmission lines 80 are set to target values. Typically, the target value of the characteristic impedance is 50 Ω.

Output voltage VDR of the power source VDR is an arbitrary voltage which enables the receivers 53A1, 53A2, 53B1 and 53B2 to receive the receive-data at an optimum operating point. The optimum operating point is given as a voltage. The optimum operating voltage of the receivers 53A1, 53A2, 53B1 and 53B2 and operating voltage (power source voltage VDD) of the drivers 51A1, 51A2, 51B1 and 51B2 are different. This is because the optimum operating points of the receivers 53A1, 53A2, 53B1 and 53B2 and the optimum operating points of the drivers 51A1, 51A2, 51B1 and 51B2 are different.

The receiver 53A2 includes a receiving circuit 63A2 and termination resistors 64A2.

A pair of input terminals of the receiving circuit 63A2 is connected to two of the transmission lines 80 via a pair of capacitors 54A2.

The receiving circuit 63A2 receives receive-data from the driver 51B2 of the LSI 20B via the capacitors 54A2 and the transmission lines 80. The receive-data is data which is transmitted from the LSI 20B to LSI 20A. The receiving circuit 63A2 transfers the differential receive-data into single-end receive-data and transfers the single-end receive data to the processing part of the LSI 20A.

For the sake of coupling the receiver 53A2 and the transmission lines 80 in an alternating current coupling configuration, the receiver 53A2 is connected to the transmission lines 80 via the capacitors 54A2. Accordingly, the receiver 53A2 and the driver 51B2 are coupled in an alternating current coupling configuration. The receiver 53A2 receives only the alternating current component of the transmit-data from the driver 51B2.

The receive-data which is received by the receiver 53A2 from the driver 51B2 is superimposed on a designated direct current voltage at the termination resistors 64A2.

The termination resistors 64A2 are constituted of a pair of variable resistors. First ends of the termination resistors 64A2 are connected to connecting points between input terminals of the receiving circuit 63A2 and two the capacitors 54A2, respectively, and second ends of the termination resistors 64A2 are connected to the power source VDR. Resistance values of the termination resistors 64A2 are adjusted in accordance with the receive adjust code input from the adjusting circuit 52A, and characteristic impedances of transmission lines between the receiving circuit 63A2 and two of the transmission lines 80 are set to target values. Typically, the target value of the characteristic impedance is 50 Ω.

Two capacitors 54A1 are inserted between two input terminals of the receiving circuit 63A1 of the receiver 53A1 and two of the transmission lines 80, respectively. The capacitors 54A1 couple the receiving circuit 63A1 and the transmission lines 80 in an alternating current coupling configuration. Accordingly, the capacitors 54A1 couple the receiver 53A1 and the driver 51B1 in an alternating current coupling configuration. The capacitors 54A1 only transfer the alternating current component of the transmit-data transmitted from the driver 51B1 to the receiver 53A1.

Two capacitors 54A2 are inserted between two input terminals of the receiving circuit 63A2 of the receiver 53A2 and two of the transmission lines 80, respectively. The capacitors 54A2 couple the receiving circuit 63A2 and the transmission lines 80 in an alternating current coupling configuration. Accordingly, the capacitors 54A2 couple the receiver 53A2 and the driver 51B2 in an alternating current coupling configuration. The capacitors 54A2 only transfer the alternating current component of the transmit-data transmitted from the driver 51B2 to the receiver 53A2.

The drivers 51B1 and 51B2, the adjusting circuit 52B, the receivers 53B1 and 53B2 and the capacitors 54B1 and 54B2 of the high speed serial interface 50B will be described hereinafter.

The driver 51B1 includes a buffer 61B1 and termination resistors 62B1.

The driver 51B2 includes a buffer 61B2 and termination resistors 62B2.

The adjusting circuit 52B includes the resistance adjusting circuit of the first embodiment. The adjusting circuit 52B outputs transmit adjust codes to the termination resistors 62B1 and 62B2 and outputs receive adjust codes to the termination resistors 64B1 and 64B2. A reference resistor 70B is connected to the adjusting circuit 52A. The resistance adjusting circuit of the first embodiment is connected to the reference resistor 70B. Details of the resistance adjusting circuit of the first embodiment will be described later.

The receiver 53B1 includes a receiving circuit 63B1 and termination resistors 64B1.

The receiver 53B2 includes a receiving circuit 63B2 and termination resistors 64B2.

Two capacitors 54B1 are inserted between two input terminals of the receiving circuit 63B1 of the receiver 53B1 and two of the transmission lines 80, respectively.

Two capacitors 54B2 are inserted between two input terminals of the receiving circuit 63B2 of the receiver 53B2 and two the transmission lines 80, respectively.

Circuit configurations of the drivers 51B1 and 51B2, the adjusting circuit 52B, the receivers 53B1 and 53B2 and capacitors 54B1 and 54B2 of the high speed serial interface 50B are similar to circuit configurations of the drivers 51A1 and 51A2, the adjusting circuit 52A, the receivers 53A1 and 53A2 and the capacitors 54A1 and 54A2 of the high speed serial interface 50A.

The circuit configurations of the drivers 51B1 and 51B2, the adjusting circuit 52B, the receivers 53B1 and 53B2 and capacitors 54B1 and 54B2 are obtained by substituting indexes "A" of the drivers 51A1 and 51A2, the adjusting circuit 52A, the receivers 53A1 and 53A2 and the capacitors 54A1 and 54A2 for "B", respectively.

Therefore, descriptions of the drivers 51B1 and 51B2, adjusting circuit 52B, the receivers 53B1 and 53B2 and the capacitors 54B1 and 54B2 of the high speed serial interface 50B are omitted.

Each of the high speed serial interfaces 50A and 50B as described above includes the adjusting circuits 52A and 52B.

The adjusting circuit 52A includes Tx termination resistors similar to the termination resistors 62A1 and 62A2 and distributes transmit adjust codes used for adjusting resistance values of the Tx termination resistors to the termination resistors 62A1 and 62A2.

The adjusting circuit 52A includes Rx termination resistors similar to the termination resistors 64A1 and 64A2 and distributes receive adjust codes used for adjusting resistance values of the Rx termination resistors to the termination resistors 64A1 and 64A2.

In a similar way, the adjusting circuit 52B includes Tx termination resistors similar to the termination resistors 62B1 and 62B2 and Rx termination resistors similar to the termination resistors 64B1 and 64B2. The adjusting circuit 52B distributes transmit adjust codes used for adjusting resistance values of the Tx termination resistors to the termination resistors 62B1 and 62B2 and distributes receive adjust codes used for adjusting resistance values of the Rx termination resistors to termination resistors 64B1 and 64B2.

The high speed serial interfaces 50A and 50B couple the receivers 53A1, 53A2, 53B1 and 53B2 and the transmission lines 80 in an alternating current coupling configuration via the capacitors 54A1, 54A2, 54B1 and 54B2.

The high speed serial interfaces 50A and 50B receive transmit-data through the alternating current coupling configuration in order to absorb voltage difference between the power source voltage VDD of the LSI 20A and the power source voltage VDD of the LSI 20B and/or to enable the receivers 53A1, 53A2, 53B1 and 53B2 to operate at the optimum operating point and receive the transmit-data. Accordingly, the capacitors 54A1, 54A2, 54B1 and 54B2 are inserted between the receivers 53A1, 53A2, 53B1 and 53B2 and the transmission lines 80.

Although an embodiment in which the capacitors 54A1 and 54A2 are included in the LSI 20A and the capacitors 54B1 and 54B2 are included in the LSI 20B is illustrated in FIG. 2, the capacitors 54A1, 54A2, 54B1 and 54B2 may be disposed outside of the LSIs 20A and 20B. For example, the capacitors 54A1, 54A2, 54B1 and 54B2 may be capacitor chips that are mounted on a PCB on which the LSIs 20A and 20B are mounted.

In a situation where the alternating current coupling configuration as described above are used, termination voltage of the termination resistors 64A1, 64A2, 64B1 and 64B2 of the receivers 53A1, 53A2, 53B1 and 53B2 are set to the arbitrary voltage (the power source VDR) which enables the receivers 53A1, 53A2, 53B1 and 53B2 to receive the receive-data at an optimum operating point.

The termination voltage VDR of the receivers 53A1, 53A2, 53B1 and 53B2 and the power source voltage VDD of the drivers 51A1, 51A2, 51B1 and 51B2 are different.

Each of the termination resistors 64A1, 64A2, 64B1 and 64B2 is a type of variable resistor which includes a plurality of resistors connected in parallel to each other and transistors connected in series with each of the resistors and varies combined resistance of the resistors by switching on/off states of the transistors, for example. By switching on/off states of the transistors, it is possible to vary number of the resistor(s) electrically connected in parallel to each other.

It is required for the termination resistors 64A1, 64A2, 64B1 and 64B2 that the transistors behave as ideal switches of which resistance values are zero and that the combined resistance value of the termination resistors 64A1, 64A2, 64B1 and 64B2 is determined only by the resistors.

However, it is necessary to increase sizes of the transistors in order to cause the transistor to behave as ideal switches of which resistance values are zero. In such a case, drain capacities of the transistors become large, and a capacity of a transmission path is increased. As a result, transmission quality of a signal is degraded.

Therefore, in this embodiment, the transistors are used as part of resistors in a state where the sizes of the transistors are decreased to a certain degree and transmission quality is ensured. In this case, the transistors become elements of which the resistance values depend on drain voltages and source voltages.

Accordingly, the resistance value of each of the termination resistors 64A1, 64A2, 64B1 and 64B2 has a dependence property which depends on a signal level of a transmission signal or the termination voltage VDR.

For all these reasons, in the high speed serial interfaces 50A and 50B as illustrated in FIG. 2, it is necessary to adjust the resistance values of the termination resistors 64A1, 64A2, 64B1 and 64B2 of the receivers 53A1, 53A2, 53B1 and 53B2 precisely in accordance with the termination voltage VDR, in particular.

In the following, configurations of the termination resistors 62A1, 62A2, 64A1, 64A2, 62B1, 62B2, 64B1 and 64B2 are described.

FIGS. 3A and 3B are diagrams illustrating circuit configurations of termination resistors 90A and 90B according to the first embodiment, respectively.

Each of the termination resistors 62A1, 62A2, 62B1 and 62B2 of the drivers 51A1, 51A2, 51B1 and 51B2 as illustrated in FIG. 2 has a circuit configuration of the termination resistor 90A as illustrated in FIG. 3A.

Each of the termination resistors 64A1, 64A2, 64B1 and 64B2 of the receivers 53A1, 53A2, 53B1 and 53B2 as illustrated in FIG. 2 has a circuit configuration of the termination resistor 90B as illustrated in FIG. 3B.

The termination resistor 90A as illustrated in FIG. 3A includes a terminal 90A1, four terminals 90A2 and adjusters 91A1, 91A2, 91A3 and 91A4. The four terminals 90A2 are provided in accordance with the four adjusters 91A1, 91A2, 91A3 and 91A4, respectively.

The terminal 90A1 outputs a signal which reflects the power source voltage VDD and a combined resistance value of the adjusters 91A1, 91A2, 91A3 and 91A4. The terminal 90A1 corresponds to lower side terminals of the termination resistors 62A1, 62A2, 62B1 and 62B2 of the drivers 51A1, 51A2, 51B1 and 51B2 as illustrated in FIG. 2.

The transmit adjust codes are input to the terminals 90A2. The terminals 90A2 correspond to terminals of the termination resistors 62A1, 62A2, 62B1 and 62B2 of the drivers 51A1, 51A2, 51B1 and 51B2 as illustrated in FIG. 2 to which the transmit adjust codes are input.

The adjusters 91A1, 91A2, 91A3 and 91A4 have similar configurations to each other.

The adjuster 91A1 includes a resistor 92A1, P channel Metal Oxide Semiconductor (PMOS) transistor 92A2 and an inverter 92A3.

The resistor 92A1 is connected between the terminal 90A1 and drain of the PMOS transistor 92A2.

With regard to the PMOS transistor 92A2, the drain is connected to the resistor 92A1, a gate is connected to an output terminal of the inverter 92A3 and a source is connected to the power source VDD.

With regard to the inverter 92A3, an input terminal is connected to the terminal 90A2 and the output terminal is connected to the gate of the PMOS transistor 92A2.

The adjusters 91A2, 91A3 and 91A4 have similar configurations to that of the adjuster 91A1. The resistors 92A1 of the adjusters 91A1, 91A2, 91A3 and 91A4 are connected in parallel with the terminal 90A1. The input terminals of the inverters 92A3 of the adjusters 91A1, 91A2, 91A3 and 91A4 are connected to the four terminals 90A2, respectively.

In the termination resistor 90A, the PMOS transistors 92A2 of the adjusters 91A1, 91A2, 91A3 and 91A4 are turned on or off in accordance with the transmit adjust codes input to the four terminals 90A2, respectively.

As a number of the PMOS transistors 92A2 that are turned on is increased, a number of the resistors 92A1 that are connected in parallel is increased. Accordingly, the combined resistance value of the termination resistor 90A is decreased.

As a number of the PMOS transistors 92A2 that are turned on is decreased, a number of the resistors 92A1 that are connected in parallel is decreased. Accordingly, the combined resistance value of the termination resistor 90A is increased.

Each of the resistance values and sizes of the PMOS transistors 92A2 of the adjusters 91A1, 91A2, 91A3 and 91A4 may be designed so that the combined resistance value increases or decreases monotonically. A number of the adjusters (91A1, 91A2, 91A3 and 91A4) may be increased or decreased for the sake of ensuring an adjustable range of the process variance.

The termination resistor 90B as illustrated in FIG. 3B includes a terminal 90B1, four terminals 90B2 and adjusters 91B1, 91B2, 91B3 and 91B4. The four terminals 90B2 are provided in accordance with the four adjusters 91B1, 91B2, 91B3 and 91B4, respectively.

The terminal 90B1 outputs a signal which reflects the termination voltage VDR and a combined resistance value of the adjusters 91B1, 91B2, 91B3 and 91B4. The terminal 90B1 corresponds to lower side terminals of the termination resistors 64A1, 64A2, 64B1 and 64B2 of the receivers 53A1, 53A2, 53B1 and 53B2 as illustrated in FIG. 2.

The receive adjust codes are input to the terminals 90B2. The terminals 90B2 correspond to terminals of the termination resistors 64A1, 64A2, 64B1 and 64B2 of the receivers 53A1, 53A2, 53B1 and 53B2 as illustrated in FIG. 2 to which the receive adjust codes are input.

The terminal 90B3 is a terminal to which the termination voltage VDR is input.

The adjusters 91B1, 91B2, 91B3 and 91B4 have similar configurations to each other.

The adjuster 91B1 includes a resistor 92B1, a PMOS transistor 92B2, an N channel Metal Oxide Semiconductor (NMOS) transistor 92B3 and an inverter 92B4.

The resistor 92B1 is connected between the terminal 90B1 and a connecting point of a drain of the PMOS transistor 92B2 and a source of the NMOS transistor 92B3.

With regard to the PMOS transistor 92B2, the drain is connected to the resistor 92B1 and the source of the NMOS transistor 92B3, a gate is connected to an output terminal of the inverter 92B4, and a source is connected to the terminal 90B3.

With regard to the NMOS transistor 92B3, the source is connected to the resistor 92B1 and the drain of the PMOS transistor 92B2, a gate is connected to the terminal 90B2, and a drain is connected to the terminal 90B3.

With regard to the inverter 92B4, an input terminal is connected to the terminal 90B2, the output terminal is connected to the gate of the PMOS transistor 92B2.

The adjusters 91B2, 91B3 and 91B4 have similar configurations to that of the adjuster 91B1. The resistors 92B1 of the adjusters 91B1, 91B2, 91B3 and 91B4 are connected in parallel with the terminal 90B1. The input terminals of the inverters 92B4 of the adjusters 91B1, 91B2, 91B3 and 91B4 are connected to the four terminals 90B2, respectively.

In the termination resistor 90B, the PMOS transistors 92B2 and the NMOS transistors 92B3 of the adjusters 91B1, 91B2, 91B3 and 91B4 are turned on or off in accordance with the receive adjust codes input to the four terminals 90B2, respectively.

As a number of the PMOS transistors 92B2 and the NMOS transistors 92B3 that are turned on is increased, a number of the resistors 92B1 that are connected in parallel is increased. Accordingly, the combined resistance value of the termination resistor 90B is decreased.

As a number of the PMOS transistors 92B2 and the NMOS transistors 92B3 that are turned on is decreased, a number of the resistors 92B1 that are connected in parallel is decreased. Accordingly, the combined resistance value of the termination resistor 90B is increased.

Each of the resistance values and sizes of the PMOS transistors 92B2 and the NMOS transistors 92B3 of the adjusters 91B1, 91B2, 91B3 and 91B4 may be designed so that the combined resistance value increases or decreases monotonically.

A number of the adjusters (91B1, 91B2, 91B3 and 91B4) may be increased or decreased for the sake of ensuring an adjustable range of the process variance. In the following, a dependence property of the combined resistance value (termination resistance value) of the termination resistor 90B as illustrated in FIG. 3B with respect to the termination voltage VDR and the signal voltage is described with reference to FIG. 4.

Figure 4:
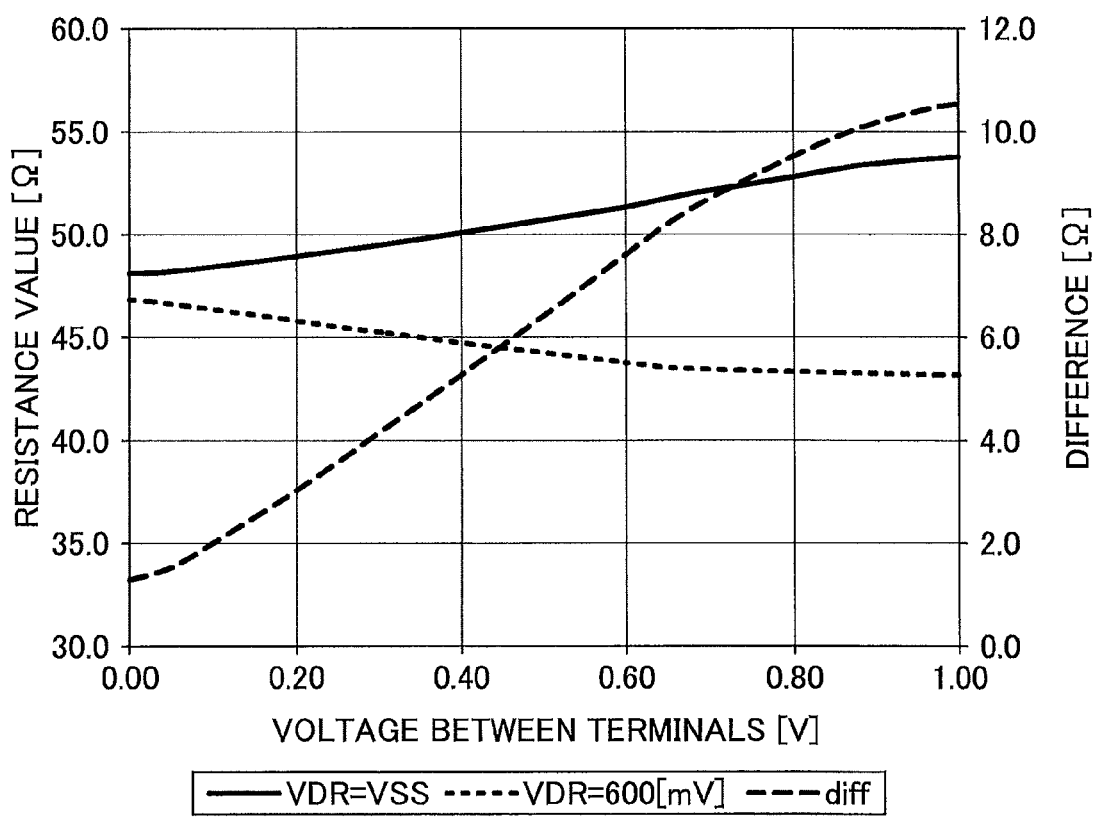
FIG. 4 is a diagram illustrating a dependence property of a termination resistance value of the termination resistor as illustrated in FIG. 3B.

FIG. 4 is a diagram illustrating the dependence property of the termination resistance value of the termination resistor 90B as illustrated in FIG. 3B with respect to the termination voltage VDR and the signal voltage.

In FIG. 4, a solid line represents characteristics of the termination resistance value with respect to a voltage between terminals. The characteristics of the solid line are obtained when the termination resistor 90A is in operation in a state where the termination voltage VDR is set to VSS (0 V) and where the receive adjust codes that are optimized for a case where the termination voltage VDR is VSS are input to the terminals 90B2. Herein, VSS is a grounded voltage. The voltage between terminals is obtained between the terminal 90B1 and the terminal 90B3 of the termination resistor 90B (see FIG. 3B).

In FIG. 4, a fine dotted line represents characteristics of the termination resistance value with respect to the voltage between terminals. The characteristics of the fine dotted line are obtained when the termination resistor 90A is in operation in a state where the termination voltage VDR is set to 600 mV and where the receive adjust codes that are optimized for a case where the termination voltage VDR is VSS are input to the terminals 90B2. A thick dotted line represents characteristics of a difference between the resistance value represented by the solid line characteristics and the resistance value represented by the fine dotted line characteristics.

The resistance values of the characteristics of the solid line and the fine dotted line are indicated on a left vertical axis in FIG. 4. The difference of the resistance values is indicated on a right vertical axis in FIG. 4. The voltage between terminals obtained between the terminal 90B1 and the terminal 90B3 of the termination resistor 90B (see FIG. 3B) is indicated on a horizontal axis.

In FIG. 4, as illustrated by the solid line, the termination resistance value becomes 50Ω in a state where the voltage between terminals is 0.4 V and where the receive adjust codes that are optimized for a case where the termination voltage VDR is VSS are input to the terminals 90B2. This corresponds to a case where the receive adjust code is set so that the voltage between the terminals becomes 0.4 V at the operating point of the termination resistor 90A and that the termination resistance value becomes 50Ω at the operating point.

If the termination resistor 90A is in operation in a case where the termination voltage VDR is 600 mV while using the receive adjust code which is optimized for the state where the termination voltage VDR is set to VSS, the termination resistance value is shifted from 50Ω as illustrated by the solid line and the fine dotted line in FIG. 4.

For example, if the voltage between the terminals becomes 0.6 V in a case where the termination voltage VDR is 600 mV, the termination resistance value is reduced by almost 8Ω compared with a case where the termination voltage VDR is VSS. Accordingly, reflection or the like of the receive-data may occur at the termination resistor 90B, and transmission characteristics of signals may be degraded.

Since the sizes of the transistors 92A2 of the termination resistor 90A are limited for the sake of suppressing degradation of transmission quality of the signals which may be caused by increased capacity of the transmission path, the termination resistance value of the termination resistor 90B indicates the dependence property with respect to the termination voltage and the voltage between terminals as illustrated in FIG. 4.

Accordingly, it is necessary to set the resistance value of the termination resistor 90B in accordance with the termination voltage VDR.

In the following, a resistance adjusting circuit 100 according to the first embodiment is described with reference to FIG. 5.

Figure 5:
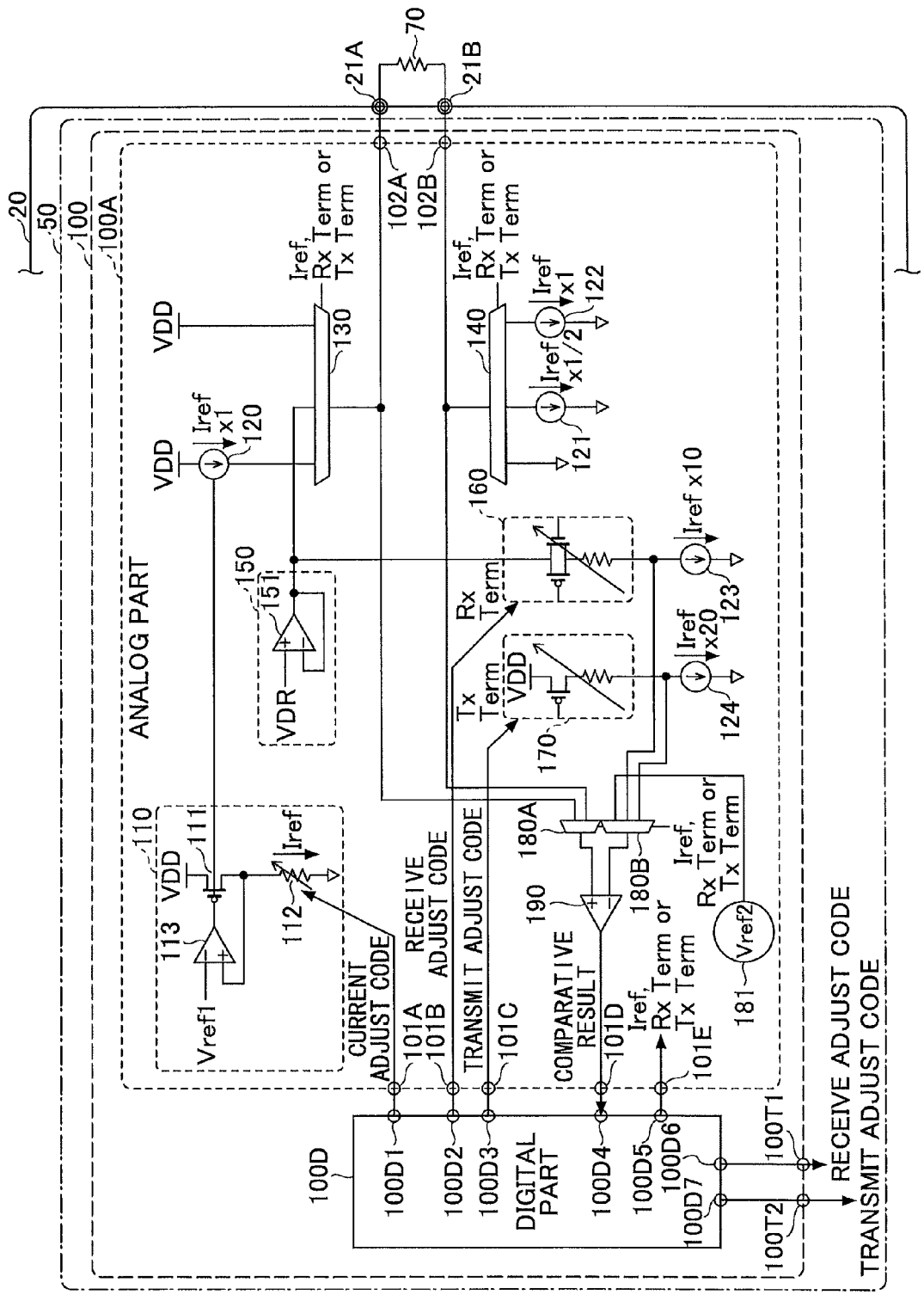
FIG. 5 is a diagram illustrating the resistance adjusting circuit according to the first embodiment.

FIG. 5 is a diagram illustrating the resistance adjusting circuit 100 according to the first embodiment.

The resistance adjusting circuit 100 includes an analog part 100A, a digital part 100D and terminals 100T1 and 100T2. The analog part 100A is constituted by a high speed and high precision CMOS circuit. The digital part 100D is constituted by a digital circuit which can perform high speed operation. Each of the adjusting circuits 52A and 52B as illustrated in FIG. 2 includes the resistance adjusting circuit 100.

In FIG. 5, the resistance adjusting circuit 100 which is included in the high speed serial interface 50 of the LSI 20 is described, for example. The LSI 20 corresponds to the LSI 20A or 20B as illustrated in FIG. 2. The high speed serial interface 50 corresponds to the high speed serial interface 50A or 50B as illustrated in FIG. 2.

The reference resistor 70 is connected to the resistance adjusting circuit 100. The reference resistor 70 corresponds to the reference resistor 70A or 70B as illustrated in FIG. 2. Hereinafter, a case where a resistance value Rref of the reference resistor 70 is 1 kΩ is described.

Although an embodiment in which the reference resistor 70 is disposed outside of the LSI 20 and is connected to the resistance adjusting circuit 100 is described, the reference resistor 70 may be included in the resistance adjusting circuit 100.

The analog part 100A of the resistance adjusting circuit 100 includes terminals 101A, 101B, 101C, 101D, 101E, 102A and 102B, a reference current generating circuit 110, constant current sources 120, 121, 122, 123 and 124 and selectors 130 and 140.

The analog part 100A of the resistance adjusting circuit 100 further includes a voltage buffer 150, termination resistors 160 and 170, selectors 180A and 180B and a comparator 190.

The digital part 100D includes terminals 100D1, 100D2, 100D3, 100D4, 100D5, 100D6 and 100D7. The terminals 100D1, 100D2, 100D3, 100D4 and 100D5 are connected to the terminals 101A, 101B, 101C, 101D and 101E of the analog part 100A, respectively. The digital part 100D is one example of a controller.

The terminals 100D1, 100D2, 100D3 and 100D5 output a current adjust code, the receive adjust code, the transmit adjust code and selection signal (Iref, Rx Term or Tx Term), respectively. A comparative result is input to the terminal 100D4 from the analog part 100A.

The terminals 100D6 and 100D7 of the digital part 100D output the receive adjust code and the transmit adjust code from the resistance adjusting circuit 100. The terminals 100D6 and 100D7 are connected to the terminals 100T1 and 100T2 of the resistance adjusting circuit 100.

The terminals 100T1 and 100T2 correspond to terminals of the adjusting circuits 52A and 52B, as illustrated in FIG. 2, from which the receive adjust code and the transmit adjust code are output.

The terminals 101A, 101B, 101C, 101D and 101E are connected to the digital part 100D.

The current adjust code is input to the terminal 101A from the digital part 100D. The terminal 101A is connected to a code input terminal of a variable resistor 112 of the reference current generating circuit 110. The digital part 100D inputs the current adjust code to the variable resistor 112 via the terminal 101A. The current adjust code is used for adjusting an output current value of the reference current generating circuit 110.

The receive adjust code is input to the terminal 101B from the digital part 100D. The terminal 101B is connected to a code input terminal of the termination resistor 160. The digital part 100D inputs the receive adjust code to the termination resistor 160 via the terminal 101B. The receive adjust code is used for adjusting the termination resistance value of the termination resistor 160. The transmit adjust code is input to the terminal 101C from the digital part 100D. The terminal 101C is connected to a code input terminal of the termination resistor 170. The digital part 100D inputs the transmit adjust code to the termination resistor 170 via the terminal 101C. The transmit adjust code is used for adjusting the termination resistance value of the termination resistor 170.

The terminal 101D outputs a signal representing a comparative result of the comparator 190 to the digital part 100D. The terminal 101D is connected to an output terminal of the comparator 190. The signal representing the comparative result of the comparator 190 is output to the digital part 100D via the terminal 101D.

A selection signal (Iref, Rx Term or Tx Term) is input to the terminal 101E from the digital part 100D. The terminal 101E is connected to selection signal input terminals of the selectors 130, 140, 180A and 180B. The digital part 100D inputs the selection signal (Iref, Rx Term or Tx Term) to the selection signal input terminals of the selectors 130, 140, 180A and 180B via the terminal 101E.

The selection signal (Iref, Rx Term or Tx Term) is used for selecting one of three modes. The selection signal Iref is used for selecting a reference current adjust mode in which a value of an ultimate current adjust code is set. The selectors 130, 140, 180A and 180B select inputs in the reference current adjust mode, if the selection signal Iref is input to the selectors 130, 140, 180A and 180B.

The selection signal Rx Term is used for selecting an Rx termination resistor adjust mode in which a value of the ultimate receive adjust code is set. The selectors 130, 140, 180A and 180B select inputs in the Rx termination resistor adjust mode, if the selection signal Rx Term is input to the selectors 130, 140, 180A and 180B.

The selection signal Tx Term is used for selecting a Tx termination resistor adjust mode in which a value of the ultimate receive adjust code is set. The selectors 130, 140, 180A and 180B select inputs in the Tx termination resistor adjust mode, if the selection signal Tx Term is input to the selectors 130, 140, 180A and 180B.

The reference current adjust mode, the Rx termination resistor adjust mode and the Tx termination resistor adjust mode will be described with reference to FIGS. 6 to 9.

The terminal 102A is connected to an output terminal of the selector 130 and a first input terminal of the selector 180A in the analog part 100A. The terminal 102A is connected to a first terminal of the reference resistor 70 via the terminal 21A of the LSI 20 outside of the analog part 100A.

The terminal 102B is connected to an output terminal of the selector 140 and a second input terminal of the selector 180A in the analog part 100A. The terminal 102B is connected to a second terminal of the reference resistor 70 via the terminal 21B of the LSI 20 outside of the analog part 100A.

The terminals 102A and 102B are terminals of the analog part 100A and are terminals of the resistance adjusting circuit 100 at the same time.

The terminals 21A and 21B are used for connecting the reference resistor 70 to the LSI 20. In FIG. 5, a left side part of the terminals 21A and 21B is an inner part of the LSI 20, a right side part of the terminals 21A and 21B is an outer part of the LSI 20. In FIG. 5, only the reference resistor 70 is located outside of the LSI 20.

The reference current generating circuit 110 generates a reference current which is used in a case where the resistance adjusting circuit 100 sets the termination resistance values of the termination resistors 160 and 170.

The reference current generating circuit 110 includes a PMOS transistor 111, a variable resistor 112 and an Op-amp 113.

A source of the PMOS transistor 111 is connected to the power source VDD. The output voltage of the power source VDD is the power source voltage VDD. A drain of the PMOS transistor 111 is connected to a first terminal of the variable resistor 112 and a non-inverted input terminal of the Op-amp 113.

A gate of the PMOS transistor 111 is connected to an output terminal of the Op-amp 113 and the constant current source 120. The PMOS transistor 111 and the constant current source 120 constitute a current mirror circuit.

With regard to the variable resistor 112, a first terminal is connected to the drain of the PMOS transistor 111 and the non-inverted input terminal of the Op-amp 113, and a second terminal is grounded. A code input terminal of the variable resistor 112 is connected to the digital part 100D via the terminal 101A.

The current adjust code is input to the variable resistor 112 from the digital part 100D via the terminal 101A. A resistance value of the variable resistor 112 is adjusted in accordance with the current adjust code, and therefore the output current value of the reference current generating circuit 110 is adjusted.

A reference voltage Vref1 is input to an inverted input terminal of the Op-amp 113. A band gap reference circuit may be used as a voltage generator of the reference voltage Vref1, for example. The non-inverted input terminal of the Op-amp 113 is connected to the drain of the PMOS transistor 111 and the first terminal of the variable resistor 112.

The output terminal of the Op-amp 113 is connected to the gate of the PMOS transistor 111 and a control terminal of the constant current source 120.

The Op-amp 113 compares the reference voltage Vref1 and a voltage of the first terminal of the variable resistor 112, and adjusts an output voltage so that the reference voltage Vref1 and the voltage of the first terminal of the variable resistor 112 becomes equal to each other.

Hereinafter, a current flowing through the variable resistor 112 of the reference current generating circuit 110 is referred to as a reference current Iref.

The constant current source 120 is connected between the power source VDD and one of three input terminals of the selector 130. The constant current source 120 and the reference current generating circuit 110 constitute the current mirror circuit. The constant current source 120 is one example of a reference current output circuit.

The constant current source 120 includes a PMOS transistor having the same size as that of the PMOS transistor 111 and having a gate connected to the output terminal of the Op-amp 113, for example. The constant current source 120 outputs a current (Iref×1) having the same current value as the reference current Iref of the reference current generating circuit 110.

Each of the constant current sources 121, 122, 123 and 124 and the reference current generating circuit 110 constitute a current mirror circuit similar to that of the constant current source 120 and the reference current generating circuit 110.

The constant current source 121 is connected between one of three input terminals of the selector 140 and a ground potential point. The constant current source 121 outputs a current (Iref×1/2) having a current value which is a half of the reference current Iref of the reference current generating circuit 110. The constant current source 121 is one example of a first current source.

The constant current source 122 is connected between one of the three input terminals of the selector 140 and the ground potential point. The constant current source 122 outputs a current (Iref×1) having the same current value as the reference current Iref of the reference current generating circuit 110. The constant current source 122 is one example of a third current source.

The constant current source 123 is connected between an output terminal of the termination resistor 160 and the ground potential point. The constant current source 123 outputs a current (Iref×10) having a current value which is ten times greater than the reference current Iref of the reference current generating circuit 110. The constant current source 123 is one example of a second current source.

The constant current source 124 is connected between an output terminal of the termination resistor 170 and the ground potential point. The constant current source 124 outputs a current (Iref×20) having a current value which is twenty times greater than the reference current Iref of the reference current generating circuit 110. The constant current source 124 is one example of a fourth current source.

The selector 130 is one example of a first selector. The selector 130 includes the three input terminals and the output terminal. The three input terminals of the selector 130 are connected to the output terminal of the constant current source 120, the output terminal of the voltage buffer 150 and the power source VDD. The output terminal of the selector 130 is connected to the terminal 102A, and a first input terminal of two input terminals of the selector 180A.

The selection signal (Iref, Rx Term or Tx Term) is input to the selection signal input terminal of the selector 130 from the digital part 100D via the terminal 101E. The selector 130 selects the constant current source 120 in a case where the selection signal Iref is input to the selection signal input terminal.

The selector 130 selects the voltage buffer 150 in a case where the selection signal Rx Term is input to the selection signal input terminal. The selector 130 selects the power source VDD in a case where the selection signal Tx Term is input to the selection signal input terminal.

The selector 140 is one example of a second selector. The selector 140 includes the three input terminals and the output terminal. The output terminal of the selector 140 is connected to the terminal 102B and a second input terminal of the selector 180A.

The three input terminals of the selector 140 are connected to the ground potential point, the constant current source 121 and the constant current source 122, respectively.

The selection signal (Iref, Rx Term or Tx Term) is input to the selection signal input terminal of the selector 140 from the digital part 100D via the terminal 101E. The selector 140 selects the ground potential point in a case where the selection signal Iref is input to the selection signal input terminal.

The selector 140 selects the constant current source 121 in a case where the selection signal Rx Term is input to the selection signal input terminal. The selector 140 selects the constant current source 122 in a case where the selection signal Tx Term is input to the selection signal input terminal.

The voltage buffer 150 is one example of a first power source, and includes an Op-amp 151. The termination voltage VDR is input to a non-inverted input terminal of the Op-amp 151. A voltage generator of the termination voltage VDR may be a voltage-dividing circuit connected between the power source VDD and the power source VSS, for example. The termination voltage VDR is set to an arbitrary voltage which enables the receivers 53A1, 53A2, 53B1 and 53B2 to receive the receive-data at the optimum operating point.

An inverted input terminal of the Op-amp 151 is connected to an output terminal of the Op-amp 151. The output terminal of the Op-amp 151 is connected to the inverted input terminal of the Op-amp 151, one of the three input terminals of the selector 130 and the input terminal of the termination resistor 160.

The Op-amp 151 outputs the termination voltage VDR to one of the three input terminals of the selector 130 and the input terminal of the termination resistor 160. The output terminal of the Op-amp 151 is as same as the output terminal of the voltage buffer 150. The termination voltage VDR of the voltage buffer 150 is one example of a first voltage.

With regard to the termination resistor 160, the input terminal is connected to the voltage buffer 150, and the output terminal is connected to the constant current source 123 and one of the three input terminals of the selector 180B. The termination resistor 160 is one example of a first variable resistor or a variable resistor.

The termination resistor 160 is similar to the termination resistors 64A1, 64A2, 64B1 and 64B2 of the receivers 53A1, 53A2, 53B1 and 53B2 as illustrated in FIG. 2. In particular, the termination resistor 160 has a circuit configuration similar to that of the termination resistor 90B as illustrated in FIG. 3B.

A termination resistance value of the termination resistor 160 is adjusted in accordance with the receive adjust code input from the digital part 100D via the terminal 101B.

The target value of the termination resistance value of the termination resistor 160 is 50Ω. The termination resistance value of the termination resistor 160 is set to the target value in the Rx termination resistor adjust mode. In the Rx termination resistor adjust mode, the selector 130 selects the voltage buffer 150, and the selector 140 selects the constant current source 121. In the Rx termination resistor adjust mode, the selector 180A selects the terminal 102B, and the selector 180B selects a connecting part between the termination resistor 160 and the constant current source 123.

Accordingly, in the Rx termination resistor adjust mode, the comparator 190 compares a voltage drop having occurred at the reference resistor 70 and a voltage drop having occurred at the termination resistor 160. The digital part 100D adjusts the receive adjust code so that the voltage drop of the reference resistor 70 and the voltage drop of the termination resistor 160 become equal to each other.

Therefore, the current value of the constant current source 123 connected to the termination resistor 160 in the Rx termination resistor adjust mode is set to current value (Iref×10). The current value (Iref×10) is obtained by multiplying the output current (Iref×1/2) of the constant current source 121 by a reciprocal ratio. The reciprocal ratio is obtained as a reciprocal number of a ratio of the target value (50Ω) of the termination resistance value of the termination resistor 160 to the resistance value (1 kΩ) of the reference resistor 70, i.e. the reciprocal number is twenty.

With regard to the termination resistor 170, the input terminal is connected to the power source VDD, and the output terminal is connected to the constant current source 124 and one of the three input terminals of the selector 180B. The termination resistor 170 is one example of the second variable resistor.

The termination resistor 170 is similar to the termination resistors 62A1, 62A2, 62B1 and 62B2 of the drivers 51A1, 51A2, 51B1 and 51B2 as illustrated in FIG. 2. In particular, the termination resistor 170 has a circuit configuration similar to that of the termination resistor 90A as illustrated in FIG. 3A.

A termination resistance value of the termination resistor 170 is adjusted in accordance with the transmit adjust code input from the digital part 100D via the terminal 101C.

The target value of the termination resistance value of the termination resistor 170 is 50Ω. The termination resistance value of the termination resistor 170 is set to the target value in the Tx termination resistor adjust mode. In the Tx termination resistor adjust mode, the selector 130 selects the power source VDD, and the selector 140 selects the constant current source 122. In the Tx termination resistor adjust mode, the selector 180A selects the terminal 102B, and the selector 180B selects a connecting part between the termination resistor 170 and the constant current source 124.

Accordingly, in the Tx termination resistor adjust mode, the comparator 190 compares a voltage drop having occurred at the reference resistor 70 and a voltage drop having occurred at the termination resistor 170. The digital part 100D adjusts the transmit adjust code so that the voltage drop of the reference resistor 70 and the voltage drop of the termination resistor 170 become equal to each other.

Therefore, the current value of the constant current source 124 connected to the termination resistor 170 in the Tx termination resistor adjust mode is set to current value (Iref×20). The current value (Iref×20) is obtained by multiplying the output current (Iref×1) of the constant current source 122 by a reciprocal ratio. The reciprocal ratio is obtained as a reciprocal number of a ratio of the target value (50Ω) of the termination resistance value of the termination resistor 170 to the resistance value (1 kΩ) of the reference resistor 70, i.e. the reciprocal number is twenty.

The selector 180A is one example of a third selector. The first input terminal of the selector 180A is connected to the output terminal of the selector 130 and the terminal 102A. The second input terminal of the selector 180A is connected to the output terminal of the selector 140 and the terminal 102B. The output terminal of the selector 180A is connected to the non-inverted input terminal of the comparator 190.

The selection signal (Iref, Rx Term or Tx Term) is input to the selection signal input terminal of the selector 180A from the digital part 100D via the terminal 101E. The selector 180A selects the terminal 102A in a case where the selection signal Iref is input to the selection signal input terminal.

The selector 180A selects the terminal 102B in a case where the selection signal Rx Term is input to the selection signal input terminal. The selector 180A selects the terminal 102B in a case where the selection signal Tx Term is input to the selection signal input terminal.

The selector 180B is one example of a fourth selector. A reference voltage Vref2 is input to one of the three input terminals of the selector 180B. A band gap reference circuit may be used as a voltage generator 181 of the reference voltage Vref2, for example. The reference voltage Vref2 is input to the inverted input terminal of the comparator 190 in a case where the value of the ultimate current adjust code is determined. The reference voltage Vref2 is used for setting a reference current of the reference current generating circuit 110. The voltage generator 181 is one example of a second power source.

Another one of the three input terminals of the selector 180B is connected to a connecting part between the termination resistor 160 and the constant current source 123. Yet another one of the three input terminals of the selector 180B is connected to a connecting part between the termination resistor 170 and the constant current source 124.

The output terminal of the selector 180B is connected to the inverted input terminal of the comparator 190.

The selection signal (Iref, Rx Term or Tx Term) is input to the selection signal input terminal of the selector 180B from the digital part 100D via the terminal 101E. The selector 180B selects the reference voltage Vref2 in a case where the selection signal Iref is input to the selection signal input terminal.

The selector 180B selects the connecting part of the termination resistor 160 and the constant current source 123 in a case where the selection signal Rx Term is input to the selection signal input terminal. The selector 180B selects the connecting part of the termination resistor 170 and the constant current source 124 in a case where the selection signal Tx Term is input to the selection signal input terminal.

The comparator 190 is one example of a comparing part. With reference to the comparator 190, the non-inverted input terminal is connected to the output terminal of the selector 180A, the inverted input terminal is connected to the output terminal of the selector 180B, and the output terminal is connected to the digital part 100D via the terminal 101D.

The comparator 190 compares the output of the selector 180A input to the non-inverted input terminal and the output of the selector 180B input to the inverted input terminal, and outputs a signal representing a comparative result to the digital part 100D.

Hereinafter, for example, the reference voltage Vref1 input to the inverted input terminal of the Op-amp 113 of the reference current generating circuit 110 is 800 mV, the reference voltage Vref2 input to the selector 180B is 400 mV, the output voltage VDR of the voltage buffer 150 is 600 mV, and the power source voltage VDD of the power source VDD is 1 V.

In the following, operations of the resistance adjusting circuit 100 in the reference current adjust mode, the Rx termination resistor adjust mode and the Tx termination resistor adjust mode are described with reference to FIGS. 6 to 9.

Figure 6:
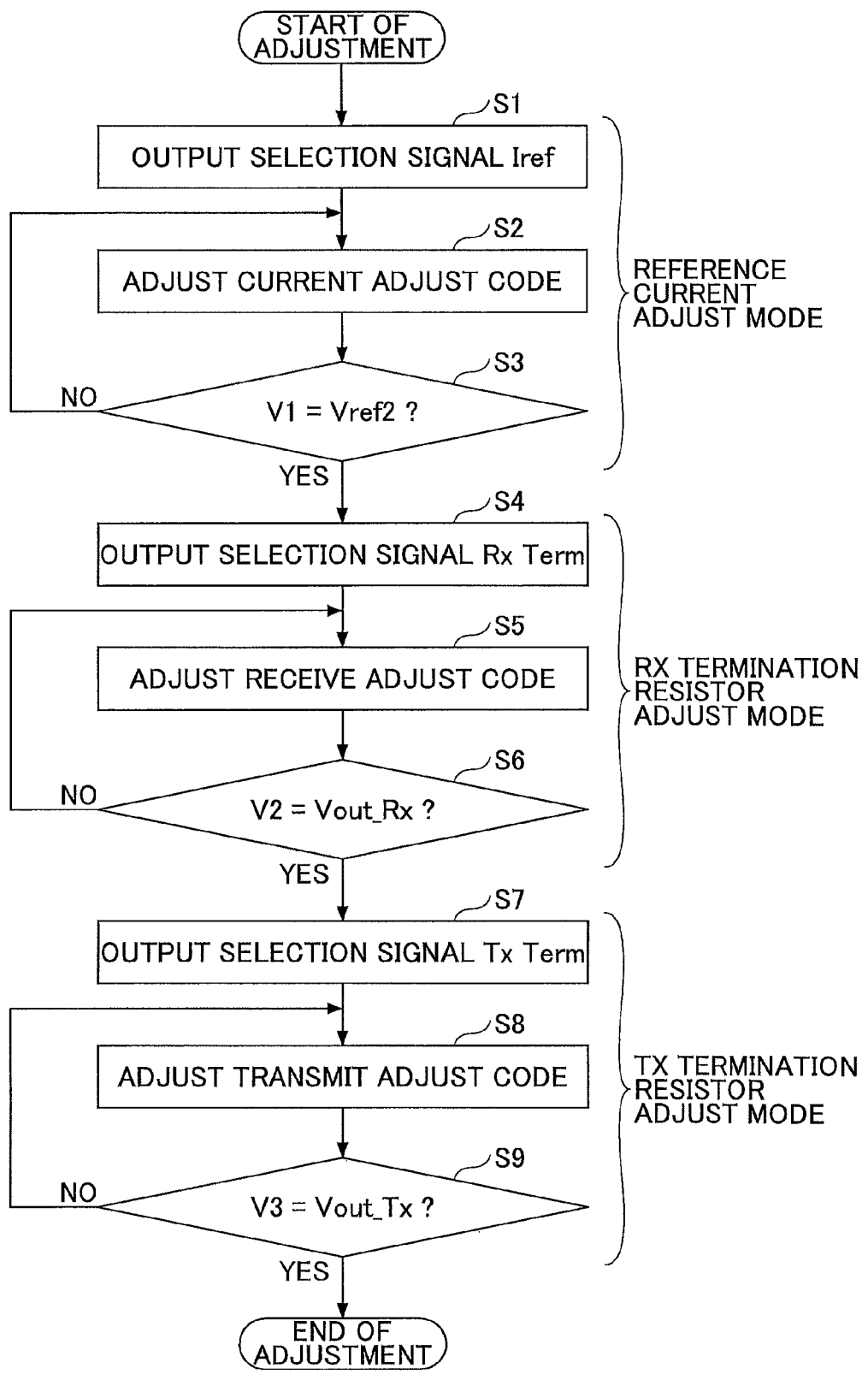
FIG. 6 is a flowchart illustrating processes of a reference current adjust mode, an Rx termination resistor adjust mode and a Tx termination resistor adjust mode of the resistance adjusting circuit.

FIG. 6 is a flowchart illustrating processes of the reference current adjust mode, the Rx termination resistor adjust mode and the Tx termination resistor adjust mode of the resistance adjusting circuit 100. The processes as illustrated in FIG. 6 is executed by the digital part 100D.

Figure 7:
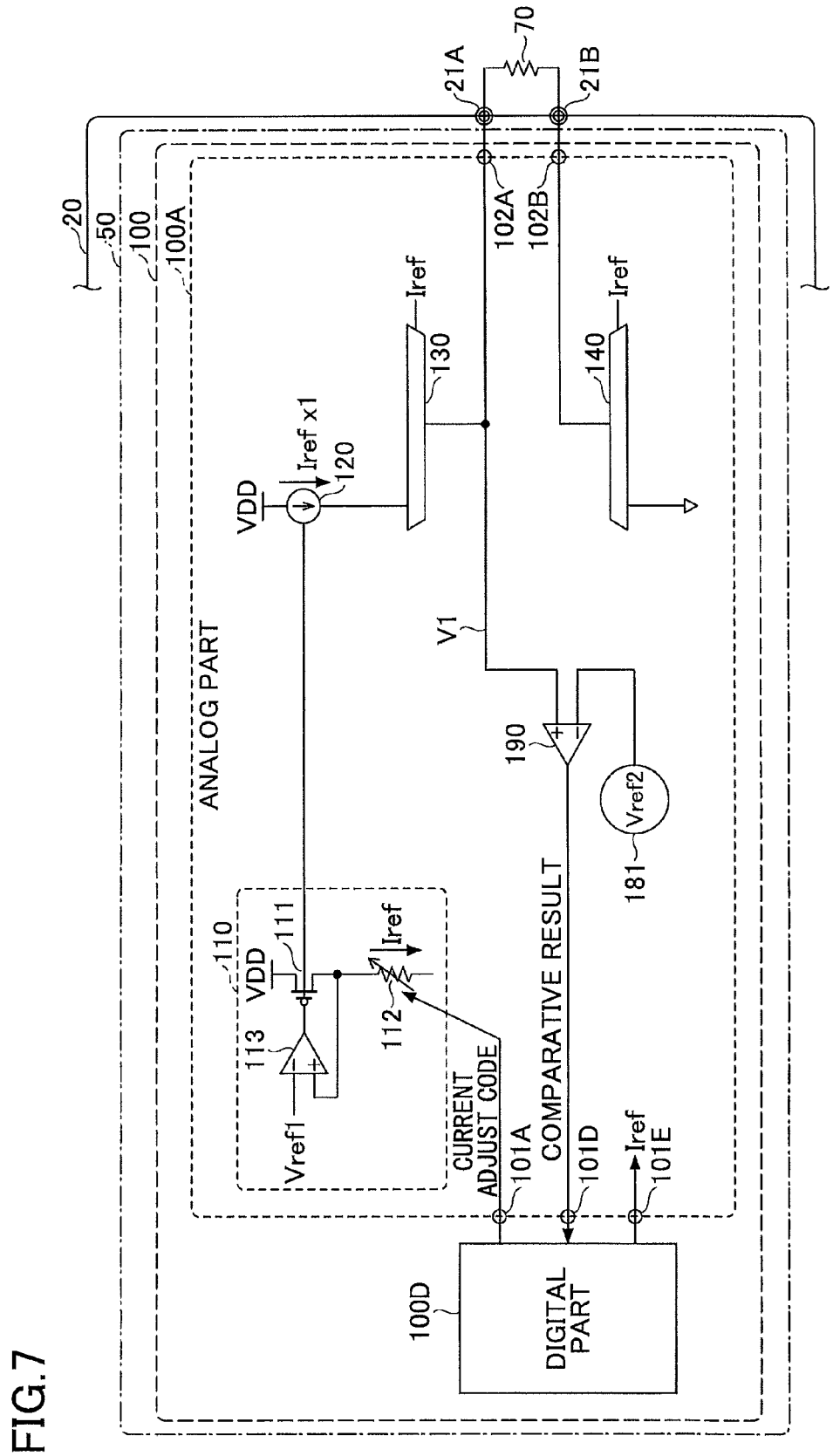
FIG. 7 is a diagram illustrating connecting relationships of the resistance adjusting circuit according to the first embodiment in the reference current adjust mode.
Figure 8:
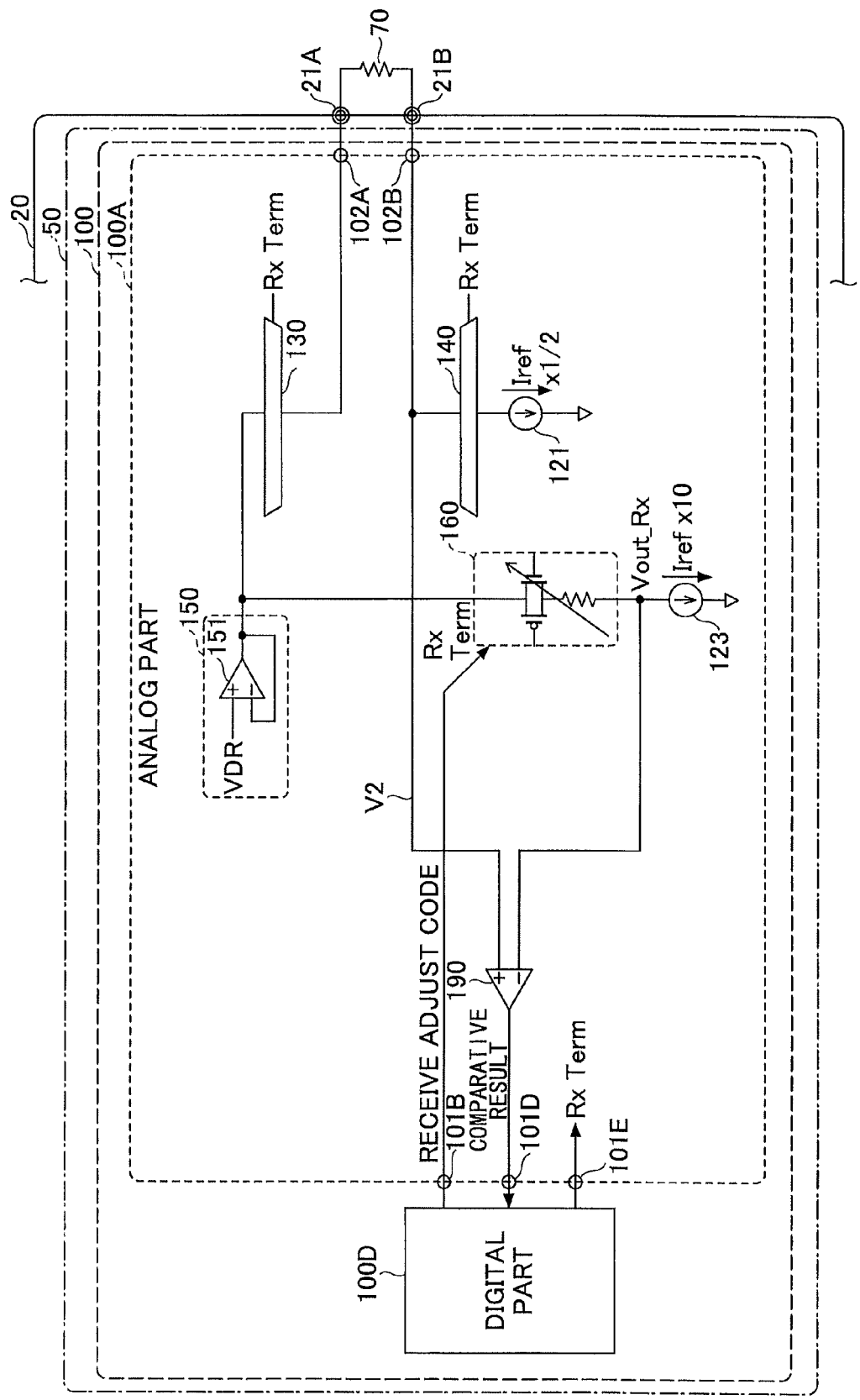
FIG. 8 is a diagram illustrating connecting relationships of the resistance adjusting circuit according to the first embodiment in the Rx termination resistor adjust mode.
Figure 9:
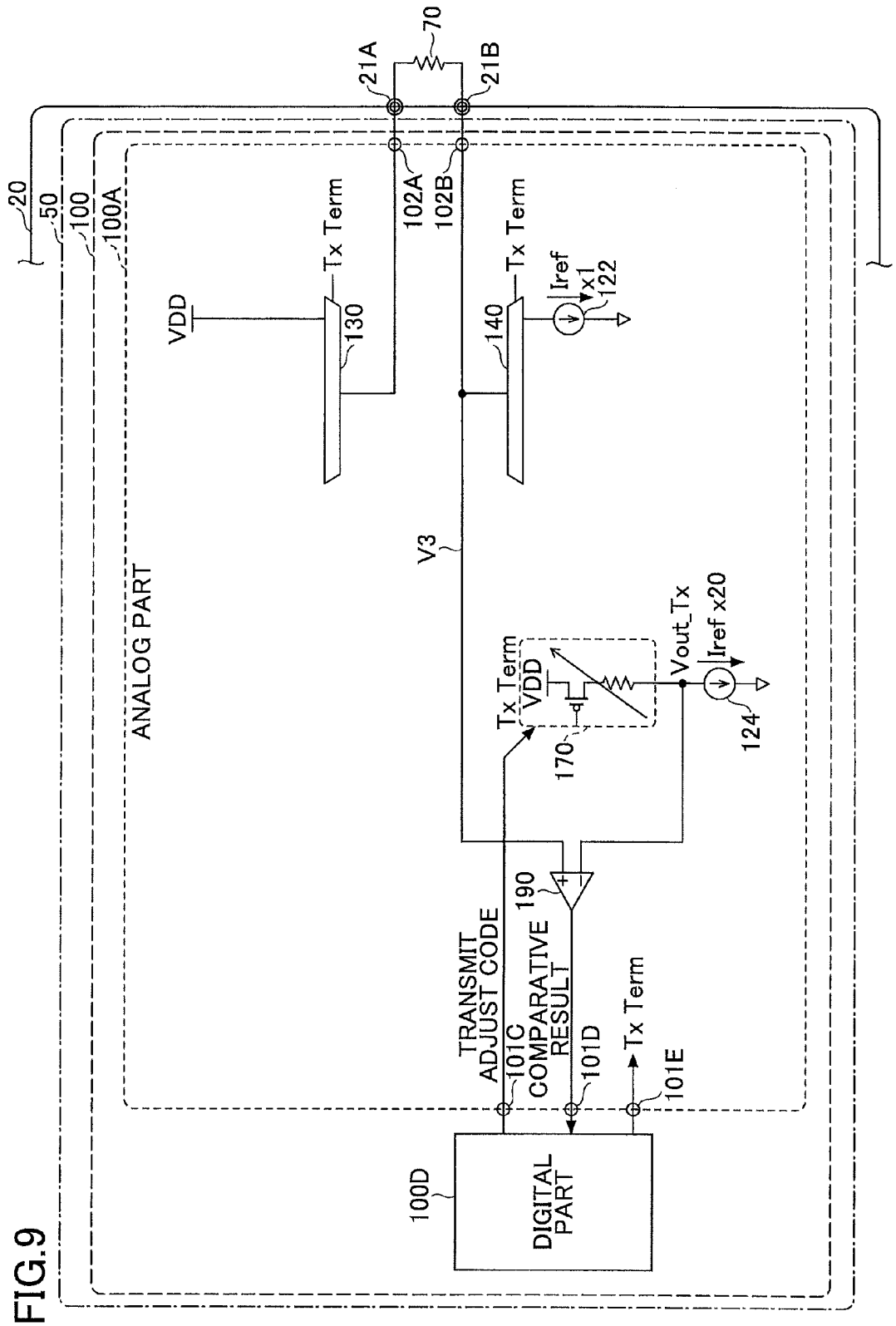
FIG. 9 is a diagram illustrating connecting relationships of the resistance adjusting circuit according to the first embodiment in the Tx termination resistor adjust mode.

FIG. 7 is a diagram illustrating connecting relationships of the resistance adjusting circuit 100 according to the first embodiment in the reference current adjust mode. FIG. 8 is a diagram illustrating connecting relationships of the resistance adjusting circuit 100 according to the first embodiment in the Rx termination resistor adjust mode. FIG. 9 is a diagram illustrating connecting relationships of the resistance adjusting circuit 100 according to the first embodiment in the Tx termination resistor adjust mode.

As illustrated in FIG. 6, when an adjustment is started, the digital part 100D outputs the selection signal Iref (step S1). The reference current adjust mode is executed starting from step S1.

In the reference current adjust mode, the selector 130 selects the constant current source 120, and the selector 140 selects the ground potential point in the analog part 100A as illustrated in FIG. 7. The selectors 180A and 180B (see FIG. 5) select the terminal 102A and the reference voltage Vref2, respectively.

Accordingly, in the analog part 100A, the current (Iref×1) of the constant current source 120 flows through the reference resistor 70 as illustrated in FIG. 7. As a result, a voltage V1 is generated between both ends of the reference resistor 70. The voltage V1 is given as follows: voltage V1=Iref×Rref=Iref×1 kΩ.

In this state, the comparator 190 outputs the signal representing the comparative result of the voltage V1 and the reference voltage Vref2 to the digital part 100D via the terminal 101D.

The digital part 100D adjusts the current adjust code based on the signal representing the comparative result input from the comparator 190 (step S2). The current adjust code is input from the digital part 100D to the reference current generating circuit 110. By this process, the current value of the reference current Iref is adjusted.

The digital part 100D determines if the voltage V1 is equal to the reference voltage Vref2 (step S3).

In a case where the digital part 100D determines that the voltage V1 is not equal to the reference voltage Vref2 (S3: NO), the digital part 100D returns to step S2 and adjusts the current adjust code.

As a result, the processes of steps S2 and S3 are executed repeatedly, until the voltage V1 becomes equal to the reference voltage Vref2. The value of the ultimate current adjust code is set by these steps.

For example, in a case where the target value of the reference current Iref is 400 μA, the reference voltage Vref2 may be set to 400 mV, in order to generate the reference current Iref of 400 μA.

If the digital part 100D determines that the voltage V1 is equal to the reference voltage Vref2 (S3:YES), the digital part 100D ends the reference current adjust mode. As a result, the reference current Iref which is adjusted by using the reference resistor 70 flows through the variable resistor 112 of the reference current generating circuit 110, and the constant current source 120 outputs a copy current (Iref×1) which is generated by copying the reference current Iref.

The currents of the constant current sources 121, 122, 123 and 124 are set by the processes of steps S1 to S3, as well.

Next, the digital part 100D outputs the selection signal Rx Term in order to execute the Rx termination resistor adjust mode (step S4).

In the Rx termination resistor adjust mode, the selector 130 selects the voltage buffer 150, and the selector 140 selects the constant current source 121 in the analog part 100A as illustrated in FIG. 8. Further, the selectors 180A and 180B (see FIG. 5) select the terminal 102B and the connecting part between the termination resistor 160 and the constant current source 123, respectively. The output voltage of the voltage buffer 150 is supplied to the termination resistor 160 and the reference resistor 70.

Accordingly, the current (Iref×1/2) which is drawn by the constant current source 121 flows through the reference resistor 70 as illustrated in FIG. 8. The current (Iref×10) which is drawn by the constant current source 123 flows through the termination resistor 160.

Then, the comparator 190 outputs the signal representing the comparative result of the voltage V2 at the terminal 102B and the voltage Vout_Rx at the connecting part between the termination resistor 160 and the constant current source 123 to the digital part 100D via the terminal 101D.

The digital part 100D adjusts the receive adjust code based on the signal representing the comparative result input from the comparator 190 (step S5). The receive adjust code is input from the digital part 100D to the termination resistor 160. Accordingly, the resistance value of the termination resistor 160 is adjusted.

The digital part 100D determines if the voltage V2 at the terminal 102B is equal to the voltage Vout_Rx at the connecting part between the termination resistor 160 and the constant current source 123 (step S6).

In a case where the digital part 100D determines that the voltage V2 is not equal to the voltage Vout_Rx (S6:NO), the digital part 100D returns to step S5 and adjusts the receive adjust code.

Accordingly, the processes of steps S5 and S6 are executed repeatedly, until the voltage V2 becomes equal to the voltage Vout_Rx. The value of the ultimate receive adjust code is set by these steps.

If the digital part 100D determines that the voltage V2 is equal to the voltage Vout_Rx (S6:YES), the digital part 100D ends the Rx termination resistor adjust mode.

Herein, the voltage V2 at the terminal 102B and the voltage Vout_Rx at the connecting part between the termination resistor 160 and the constant current source 123 are calculated as follows. The termination resistance value of the termination resistor 160 is referred to as RRx.

The voltage V2 at the terminal 102B is given as follows: V2=VDR−Rref×(Iref×1/2). The voltage Vout_Rx at the connecting part between the termination resistor 160 and the constant current source 123 is given as follows: Vout_Rx=VDR−RRx×Iref×10. Accordingly, at step S6, the digital part 100D sets the termination resistance value RRx of the termination resistor 160 by adjusting the receive adjust code so that the voltage V2 at the terminal 102B becomes equal to the voltage Vout_Rx at the connecting part between the termination resistor 160 and the constant current source 123.

In other words, in the Rx termination resistor adjust mode, the comparator 190 compares the voltage drop having occurred at the reference resistor 70 and the voltage drop having occurred at the termination resistor 160. The digital part 100D adjusts the receive adjust code so that the voltage drop of the reference resistor 70 and the voltage drop of the termination resistor 160 become equal to each other.

Since the output current (Iref×10) of the constant current source 123 is twenty times greater than the output current (Iref×1/2) of the constant current source 121, the termination resistance value RRx of the termination resistor 160 is set to 50Ω which is obtained by multiplying resistance value Rref (1 kΩ) of the reference resistor 70 by a reciprocal ratio. The reciprocal ratio is obtained as a reciprocal number of a ratio of the output current (Iref×10) and the output current (Iref×1/2). The reciprocal number is twenty. This is the target value of the termination resistance value RRx of the termination resistor 160.

For example, the voltage V2 is given as follows: V2=VDR−Rref×(Iref×1/2)=600 mV−(1 k×200 μA)=400 mV. Before executing the Rx termination resistor adjust mode, the termination resistance value RRx of the termination resistor 160 may be an arbitrary value. Therefore, the voltage Vout_Rx at the connecting part between the termination resistor 160 and the constant current source 123 may be different from the voltage V2, i.e. there may be a voltage difference.

The comparator 190 compares the voltage Vout_Rx and the voltage V2, and the digital part 100D adjusts the receive adjust code based on the comparative result. As a result, the termination resistance value RRx of the termination resistor 160 is adjusted. Accordingly, the voltage Vout_Rx is given as follows: Vout_Rx=VDR×RRx×Iref×10=600 mV−50×10×400 μA=400 mV. As a result, the voltage Vout_Rx and the voltage V2 become equal to each other. Finally, the termination resistance value RRx of the termination resistor 160 is set to the target value, i.e. 50 Ω.

According to the resistance adjusting circuit 100 of the first embodiment, the reference current (Iref) is generated by using the reference resistor 70 in the reference current adjust mode before executing the Rx termination resistor adjust mode. In the Rx termination resistor adjust mode, the ultimate receive adjust code is determined by using the output current (Iref×1/2), the reference resistor 70 and the voltage buffer 150. The output current (Iref×1/2) of the constant current source 121 is set by using the reference current (Iref) in the reference current adjust mode. This indicates that the receive adjust code is determined at the operating point in an actual receive operation.

Accordingly, it is possible to set the receive adjust code precisely. The digital part 100D (see FIG. 5) inputs the receive adjust code to the termination resistors 64A1, 64A2, 64B1 and 64B2 of the receivers 53A1, 53A2, 53B1 and 53B2 (see FIG. 2) via the terminal 100T1.

Next, the digital part 100D outputs the selection signal Tx Term in order to execute the Tx termination resistor adjust mode (step S7).

In the Tx termination resistor adjust mode, the selector 130 selects the power source VDD, and the selector 140 selects the constant current source 122 in the analog part 100A as illustrated in FIG. 9. Further, the selectors 180A and 180B (see FIG. 5) select the terminal 102B and the connecting part between the termination resistor 170 and the constant current source 124, respectively. The output voltage of the power source VDD is supplied to the termination resistor 170 and the reference resistor 70.

Accordingly, the current (Iref×1) which is drawn by the constant current source 122 flows through the reference resistor 70 as illustrated in FIG. 9. The current (Iref×20) which is drawn by the constant current source 124 flows through the termination resistor 170.

Then, the comparator 190 outputs the signal representing the comparative result of the voltage V3 at the terminal 102B and the voltage Vout_Tx at the connecting part between the termination resistor 170 and the constant current source 124 to the digital part 100D via the terminal 101D.

The digital part 100D adjusts the transmit adjust code based on the signal representing the comparative result input from the comparator 190 (step S8). The transmit adjust code is input from the digital part 100D to the termination resistor 170. Accordingly, the resistance value of the termination resistor 170 is adjusted.

The digital part 100D determines if the voltage V3 at the terminal 102B is equal to the voltage Vout_Tx at the connecting part between the termination resistor 170 and the constant current source 124 (step S9).

In a case where the digital part 100D determines that the voltage V3 is not equal to the voltage Vout_Tx (S9: NO), the digital part 100D returns to step S8 and adjusts the transmit adjust code.

Accordingly, the processes of steps S8 and S9 are executed repeatedly, until the voltage V3 becomes equal to the voltage Vout_Tx. The value of the ultimate transmit adjust code is set by these steps.

If the digital part 100D determines that the voltage V3 is equal to the voltage Vout_Tx (S9: YES), the digital part 100D ends the Tx termination resistor adjust mode.

Herein, the voltage V3 at the terminal 102B and the voltage Vout_Tx at the connecting part between the termination resistor 170 and the constant current source 124 are calculated as follows. The termination resistance value of the termination resistor 170 is referred to as RTx.

The voltage V3 at the terminal 102B is given as follows: V3=VDD−Rrefx(Iref×1). The voltage Vout_Tx at the connecting part between the termination resistor 170 and the constant current source 124 is given as follows: Vout_Tx=VDD−RTx×Iref×20. Accordingly, at step S9, the digital part 100D sets the termination resistance value RTx of the termination resistor 170 by adjusting the transmit adjust code so that the voltage V3 at the terminal 102B becomes equal to the voltage Vout_Tx at the connecting part between the termination resistor 170 and the constant current source 124.

In other words, in the Tx termination resistor adjust mode, the comparator 190 compares a voltage drop having occurred at the reference resistor 70 and a voltage drop having occurred at the termination resistor 170. The digital part 100D adjusts the transmit adjust code so that the voltage drop of the reference resistor 70 and the voltage drop of the termination resistor 170 become equal to each other.

Since the output current (Iref×20) of the constant current source 124 is twenty times greater than the output current (Iref×1) of the constant current source 122, the termination resistance value RTx of the termination resistor 170 is set to 50Ω which is obtained by multiplying resistance value Rref (1 kΩ) of the reference resistor 70 by a reciprocal ratio. The reciprocal ratio is obtained as a reciprocal number of a ratio of the output current (Iref×20) and the output current (Iref×1). The reciprocal number is twenty. This is the target value of the termination resistance value RTx of the termination resistor 170.

For example, the voltage V3 is given as follows: V3=VDD−Rref×(Iref×1)=1V−(1 k×400=600 mV. Before executing the Tx termination resistor adjust mode, the termination resistance value RTx of the termination resistor 170 may be an arbitrary value. Therefore, the voltage Vout_Tx at the connecting part between the termination resistor 170 and the constant current source 124 may be different from the voltage V3, i.e. there may be a voltage difference.

The comparator 190 compares the voltage Vout_Tx and the voltage V3, and the digital part 100D adjusts the transmit adjust code based on the comparative result. As a result, the termination resistance value RTx of the termination resistor 170 is adjusted. Accordingly, the voltage Vout_Tx is given as follows: Vout_Tx=VDD−RTx×Iref×20=1 V−50×20×400 μA=600 mV. As a result, the voltage Vout_Tx and the voltage V3 become equal to each other. Finally, the termination resistance value RTx of the termination resistor 170 is set to the target value, i.e. 50 Ω.

Accordingly, it is possible to set the transmit adjust code precisely. The digital part 100D (see FIG. 5) inputs the transmit adjust code to the termination resistors 62A1, 62A2, 62B1 and 62B2 of the drivers 51A1, 51A2, 51B1 and 51B2 (see FIG. 2) via the terminal 100T2.

As described above, the resistance adjusting circuit 100 uses the constant current sources 121 and 123, the reference resistor 70 and the voltage buffer 150 in the Rx termination resistor adjust mode. The constant current sources 121 and 123 output currents based on the reference current of the reference current generating circuit 110. Accordingly, it becomes possible to set the termination resistance value RRx of the termination resistor 160 to the target value, i.e. 50Ω, in accordance with the arbitrary termination voltage VDR of the voltage buffer 150.

Therefore, in a case where the arbitrary termination voltage VDR of the receivers 53A1, 53A2, 53B1 and 53B2 and the power source voltage VDD of the drivers 53A1, 53A2, 53B1 and 53B2 are different from each other, it is possible to set the termination resistance value RRx of the termination resistor 160 to the target value (50Ω) precisely in accordance with the termination voltage VDR.

According to the first embodiment, it is possible to provide the resistance adjusting circuit 100 which can set the termination resistance value used at an Rx circuit such as the termination resistor 160 precisely in accordance with the arbitrary termination voltage VDR.

Since the termination resistance value at the Rx circuit can be set precisely by executing the processes of steps S4 to S6, it is possible to provide the resistance adjusting method which can set the termination resistance value at the Rx circuit precisely.

The Rx termination resistor adjust mode of the resistance adjusting circuit 100 according to the first embodiment is executed after executing the reference current adjust mode (see steps S1 to S3). In the reference current adjust mode, the reference current (Iref) output from the reference current generating circuit 110 is set by using the reference resistor 70.

After setting the reference current (Iref) in the reference current adjust mode, the termination resistance value RRx of the termination resistor 160 is adjusted by using the constant current sources 121 and 123, the reference resistor 70 and the voltage buffer 150. The constant current sources 121 and 123 output the currents based on the reference current (Iref). Accordingly, it is possible to set the termination resistance value RRx to the target value, i.e. 50Ω, with high accuracy.

The resistance adjusting circuit 100 uses the constant current sources 122 and 124, the reference resistor 70 and the power source voltage VDD in the Tx termination resistor adjust mode. The constant current sources 122 and 124 output currents based on the reference current of the reference current generating circuit 110. Accordingly, it is possible to set the termination resistance value RTx of the termination resistor 170 to the target value, i.e. 50 Ω.

According to the first embodiment, it is possible to provide the resistance adjusting circuit 100 which can set the termination resistance value at a Tx circuit such as the termination resistor 170 with high accuracy.

Although the embodiment in which the reference current adjust mode (S1~S3), the Rx termination resistor adjust mode (S4 to S6) and the Tx termination resistor adjust mode (S7 to S9) are executed in this order is described with reference to FIG. 6.

However, an order of the Rx termination resistor adjust mode (S4 to S6) and an order of the Tx termination resistor adjust mode (S7 to S9) may be interchanged.

According to the embodiment as described above, the termination resistance value RRx of the termination resistor 160 is set to the target value (50Ω) by using the constant current sources 121 and 123 that output the currents based on the reference current of the reference current generating circuit 110 in the Rx termination resistor adjust mode.

However, a circuit which generates the reference current is not limited to a circuit having a circuit configuration such as the reference current generating circuit 110. The circuit which generates the reference current may be different from the reference current generating circuit 110 as illustrated in FIG. 5, as long as the constant current sources 121 and 123 can output the currents based on the reference current which is adjusted by using the reference resistor 70.

The embodiment in which the selectors 180A and 180B select input signals of the comparator 190 is described above.

However, the resistance adjusting circuit 100 may have three comparators similar to the comparator 190 in order to execute the reference current adjust mode, the Rx termination resistor adjust mode and the Tx termination resistor adjust mode. In this case, the selectors 180A and 180B are not included in the resistance adjusting circuit 100.

According to the resistance adjusting circuit 100 of the first embodiment, it is possible to set the reference current in the reference current adjust mode and to set the termination resistance value of the Rx circuit in the Rx termination resistor adjust mode by using one reference resistor 70.

According to the resistance adjusting circuit 100 of the first embodiment, it is possible to set the reference current in the reference current adjust mode and to set the termination resistance value of the Tx circuit in the Tx termination resistor adjust mode by using one reference resistor 70.

Since the reference current and the termination resistance values of the Tx and Rx circuits can be set by using one reference resistor 70, it is possible to minimize a size or number of elements disposed outside of the LSI 20 in order to adjust the termination resistance value of the Rx circuit to which the arbitrary termination voltage VDR is supplied. For example, it is not necessary to add a power source or the like in order to adjust the termination resistance value of the Rx circuit to which the arbitrary termination voltage VDR is supplied.

According to the first embodiment, it is possible to reduce manufacturing cost of the resistance adjusting circuit 100.

According to the resistance adjusting circuit 100 of the first embodiment, it is possible to set the termination resistance value to the target value (50Ω) of the Rx circuit to which the arbitrary termination voltage VDR is supplied by using the constant current sources 121 and 123, the reference resistor 70 and the voltage buffer 150. The constant current sources 121 and 123 output the currents based on the reference current of the reference current generating circuit 110. Therefore, it is possible to receive high quality data in the resistance adjusting circuit 100.

<Second Embodiment>

Figure 10:
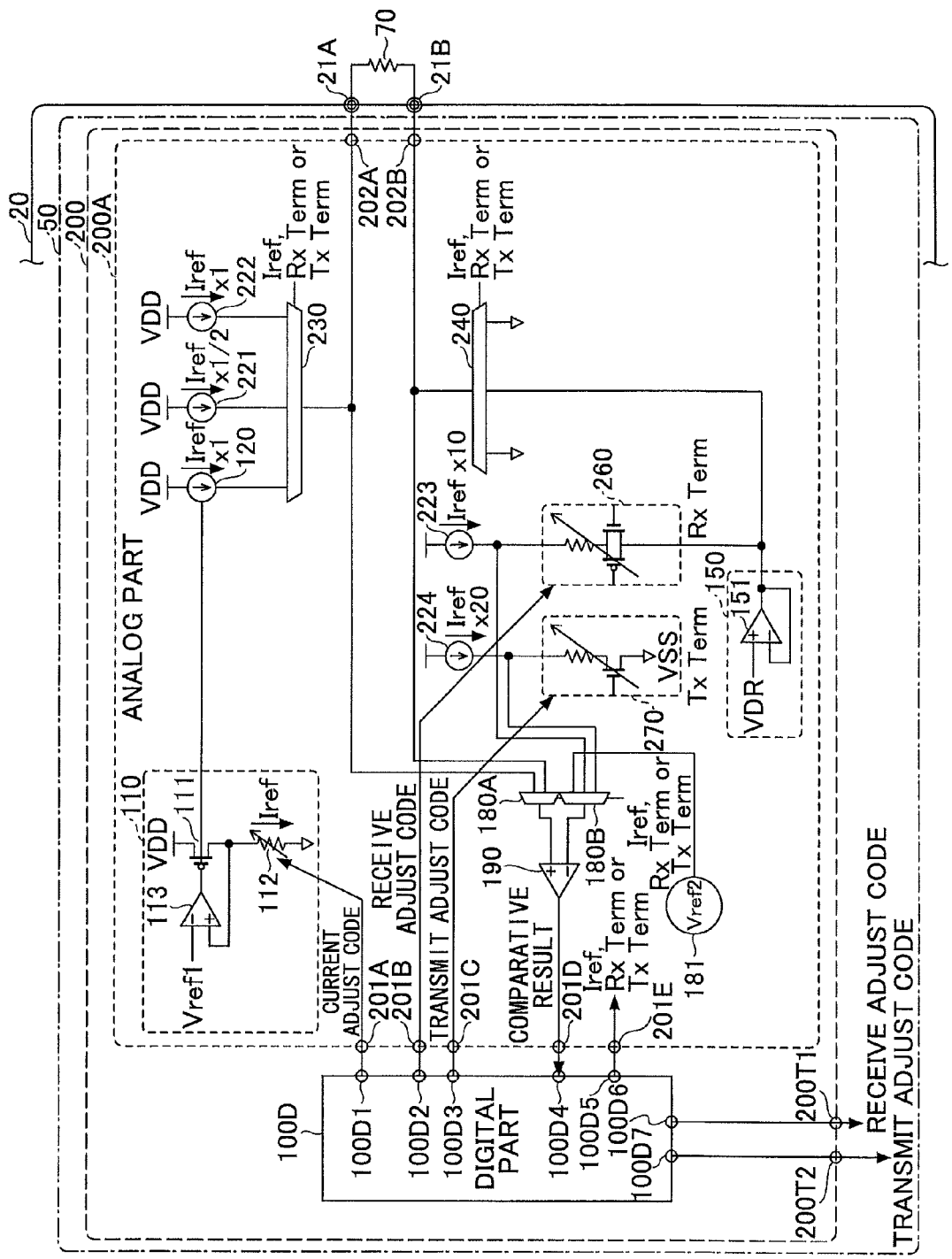
FIG. 10 is a diagram illustrating a resistance adjusting circuit according to a second embodiment.

FIG. 10 is a diagram illustrating the resistance adjusting circuit 200 according to the second embodiment.

The resistance adjusting circuit 200 includes an analog part 200A, a digital part 100D and terminals 200T1 and 200T. The analog part 200A is constituted by a high speed and high precision CMOS circuit. The digital part 100D is constituted by a digital circuit which can perform high speed operation. Each of the adjusting circuits 52A and 52B as illustrated in FIG. 2 includes the resistance adjusting circuit 200.

The resistance adjusting circuit 200 according to the second embodiment includes termination resistors 260 and 270 instead of the termination resistors 160 and 170 of the resistance adjusting circuit 100 according to the first embodiment. The termination resistors 260 and 270 have configurations in which connecting relationships around current sources and potential points are different from those of the termination resistors 160 and 170 according to the first embodiment.

The termination resistor 270 includes an N channel Metal Oxide Semiconductor (NMOS) transistor. In this point, the termination resistor 270 is different from the termination resistor 170 including the PMOS transistor.

The resistance adjusting circuit 200 according to the second embodiment has differences with regard to circuit configurations other than the differences as described above, compared with the resistance adjusting circuit 100 according to the first embodiment.

Accordingly, the same elements as or elements similar to those of the resistance adjusting circuit 100 of the first embodiment are referred to by the same reference numerals, and a description thereof is omitted.

In FIG. 10, the resistance adjusting circuit 200 which is included in the high speed serial interface 50 of the LSI 20 is described, for example. The LSI 20 corresponds to the LSI 20A or 20B as illustrated in FIG. 2. The high speed serial interface 50 corresponds to the high speed serial interface 50A or 50B as illustrated in FIG. 2.

The reference resistor 70 is connected to the resistance adjusting circuit 200. The reference resistor 70 corresponds to the reference resistor 70A or 70B as illustrated in FIG. 2. Hereinafter, a case where a resistance value Rref of the reference resistor 70 is 1 kΩ is described.

Although an embodiment in which the reference resistor 70 is disposed outside of the LSI 20 and is connected to the resistance adjusting circuit 200 is described, the reference resistor 70 may be included in the resistance adjusting circuit 200.

The analog part 200A of the resistance adjusting circuit 200 includes terminals 201A, 201B, 201C, 201D, 201E, 202A and 202B, a reference current generating circuit 110, constant current sources 221, 222, 223, 224 and selectors 230 and 240.

The analog part 200A of the resistance adjusting circuit 200 further includes a voltage buffer 150, termination resistors 260 and 270, selectors 180A and 180B and a comparator 190.

The digital part 100D is similar to the digital part 100D of the first embodiment, and the terminals 100D1, 100D2, 100D3, 100D4 and 100D5 of the digital part 100D are connected to the terminals 201A, 201B, 201C, 201D and 201E of the analog part 200A, respectively. The analog part 200A inputs a comparative result to the terminal 100D4.

The terminals 100D6 and 100D7 of the digital part 100D output the receive adjust code and the transmit adjust code from the resistance adjusting circuit 200. The terminals 100D6 and 100D7 are connected to the terminals 200T1 and 200T2 of the resistance adjusting circuit 200.

The terminals 200T1 and 200T2 correspond to terminals of the adjusting circuits 52A and 52B, as illustrated in FIG. 2, from which the receive adjust code and the transmit adjust code are output.

The terminals 201A, 201B, 201C, 201D and 201E are connected to the digital part 100D.

The current adjust code is input to the terminal 201A from the digital part 100D. The terminal 201A is connected to a code input terminal of a variable resistor 112 of the reference current generating circuit 110. The digital part 100D inputs the current adjust code to the variable resistor 112 via the terminal 201A. The current adjust code is used for adjusting an output current value of the reference current generating circuit 110.

The receive adjust code is input to the terminal 201B from the digital part 100D. The terminal 201B is connected to a code input terminal of the termination resistor 260. The digital part 100D inputs the receive adjust code to the termination resistor 260 via the terminal 201B. The receive adjust code is used for adjusting the termination resistance value of the termination resistor 260.

The transmit adjust code is input to the terminal 201C from the digital part 100D. The terminal 201C is connected to a code input terminal of the termination resistor 270. The digital part 100D inputs the transmit adjust code to the termination resistor 270 via the terminal 201C. The transmit adjust code is used for adjusting the termination resistance value of the termination resistor 270.

The terminal 201D outputs a signal representing a comparative result of the comparator 190 to the digital part 100D. The terminal 201D is connected to an output terminal of the comparator 190. The signal representing the comparative result of the comparator 190 is output to the digital part 100D via the terminal 201D.

A selection signal (Iref, Rx Term or Tx Term) is input to the terminal 201E from the digital part 100D. The terminal 201E is connected to selection signal input terminals of the selectors 230, 240, 180A and 180B. The digital part 100D inputs the selection signal (Iref, Rx Term or Tx Term) to the selection signal input terminals of the selectors 230, 240, 180A and 180B via the terminal 201E.

The terminal 202A is connected to an output terminal of the selector 230 and a first input terminal of the selector 180A in the analog part 200A. The terminal 202A is connected to a first terminal of the reference resistor 70 via the terminal 21A of the LSI 20 outside of the analog part 200A.

The terminal 202B is connected to an output terminal of the selector 240 and a second input terminal of the selector 180A in the analog part 200A. The terminal 202B is connected to a second terminal of the reference resistor 70 via the terminal 21B of the LSI 20 outside of the analog part 200A.

The terminals 202A and 202B are terminals of the analog part 200A and are terminals of the resistance adjusting circuit 200 at the same time.

The terminals 21A and 21B are used for connecting the reference resistor 70 to the LSI 20. In FIG. 10, a left side part of the terminals 21A and 21B is an inner part of the LSI 20, a right side part of the terminals 21A and 21B is an outer part of the LSI 20. In FIG. 10, only the reference resistor 70 is located outside of the LSI 20.

The reference current generating circuit 110 generates a reference current which is used in a case where the resistance adjusting circuit 200 sets the termination resistance values of the termination resistors 260 and 270.

The constant current source 120 is connected between the power source VDD and one of three input terminals of the selector 230. The constant current source 120 and the reference current generating circuit 110 constitutes the current mirror circuit.

Each of the constant current sources 221, 222, 223 and 224 combined individually with the reference current generating circuit 110 constitutes a current mirror circuit similar to that of the constant current source 120 and the reference current generating circuit 110 of FIG. 5.

The constant current source 221 is connected between the power source VDD and one of three input terminals of the selector 230. The constant current source 221 outputs a current (Iref×1/2) having a current value which is a half of the reference current Iref of the reference current generating circuit 110.

The constant current source 222 is connected between the power source VDD and one of the three input terminals of the selector 230. The constant current source 222 outputs a current (Iref×1) having the same current value as the reference current Iref of the reference current generating circuit 110.

The constant current source 223 is connected between the power source VDD and the termination resistor 260. The constant current source 223 outputs a current (Iref×10) having a current value which is ten times greater than the reference current Iref of the reference current generating circuit 110 to the termination resistor 260.

The constant current source 224 is connected between the power source VDD and the termination resistor 270. The constant current source 224 outputs a current (Iref×20) having a current value which is twenty times greater than the reference current Iref of the reference current generating circuit 110 to the termination resistor 270.

The selector 230 includes the three input terminals and the output terminal. The three input terminals of the selector 230 are connected to the output terminals of the constant current source 120, the constant current source 221 and the constant current source 222. The output terminal of the selector 230 is connected to the terminal 202A, a first input terminal of two input terminals of the selector 180A.

The selection signal (Iref, Rx Term or Tx Term) is input to the selection signal input terminal of the selector 230 from the digital part 100D via the terminal 201E. The selector 230 selects the constant current source 120 in a case where the selection signal Iref is input to the selection signal input terminal.

The selector 230 selects the constant current source 221 in a case where the selection signal Rx Term is input to the selection signal input terminal. The selector 230 selects the constant current source 222 in a case where the selection signal Tx Term is input to the selection signal input terminal.

The selector 240 includes the three input terminals and the output terminal. The output terminal of the selector 240 is connected to the terminal 202B and a second input terminal of the selector 180A.

One of the input terminals of the selector 240 is connected to the output terminal of the voltage buffer 150, and the other two input terminals are connected to the ground potential point.

The selection signal (Iref, Rx Term or Tx Term) is input to the selection signal input terminal of the selector 240 from the digital part 100D via the terminal 201E. The selector 240 selects the ground potential point in a case where the selection signal Iref is input to the selection signal input terminal.

The selector 240 selects the voltage buffer 150 in a case where the selection signal Rx Term is input to the selection signal input terminal. The selector 240 selects the ground potential point in a case where the selection signal Tx Term is input to the selection signal input terminal.

The voltage buffer 150 is similar to the voltage buffer 150 of the first embodiment except for points in that the output terminal is connected to the termination resistor 260 and the input terminal of the selector 240.

With regard to the termination resistor 260, the input terminal is connected to the voltage buffer 150, the output terminal is connected to the constant current source 223 and one of the three input terminals of the selector 180B.

The termination resistor 260 is similar to the termination resistors 64A1, 64A2, 64B1 and 64B2 of the receivers 53A1, 53A2, 53B1 and 53B2 as illustrated in FIG. 2. In particular, the termination resistor 260 has a circuit configuration similar to that of the termination resistor 90B as illustrated in FIG. 3B.

A termination resistance value of the termination resistor 260 is adjusted in accordance with the receive adjust code input from the digital part 100D via the terminal 201B.

The target value of the termination resistance value of the termination resistor 260 is 50Ω. The termination resistance value of the termination resistor 260 is set to the target value in the Rx termination resistor adjust mode. In the Rx termination resistor adjust mode, the selector 230 selects the constant current source 221, and the selector 140 selects the voltage buffer 150. In the Rx termination resistor adjust mode, the selector 180A selects the terminal 202A, and the selector 180B selects a connecting part between the termination resistor 260 and the constant current source 223.

Accordingly, in the Rx termination resistor adjust mode, the comparator 190 compares a voltage drop having occurred at the reference resistor 70 and a voltage drop having occurred at the termination resistor 260. The digital part 100D adjusts the receive adjust code so that the voltage drop of the reference resistor 70 and the voltage drop of the termination resistor 260 become equal to each other.

Therefore, the current value of the constant current source 223 connected to the termination resistor 260 in the Rx termination resistor adjust mode is set to current value (Iref×10). The current value (Iref×10) is obtained by multiplying the output current (Iref×1/2) of the constant current source 221 by a reciprocal ratio. The reciprocal ratio is obtained as a reciprocal number of a ratio of the target value (50Ω) of the termination resistance value of the termination resistor 260 to the resistance value (1 kΩ) of the reference resistor 70, i.e. the reciprocal number is twenty.

With regard to the termination resistor 270, the input terminal is connected to the ground potential point, the output terminal is connected to the constant current source 224 and one of the three input terminals of the selector 180B. A circuit configuration of the termination resistor 270 will be described in detail with reference to FIG. 11.

A termination resistance value of the termination resistor 270 is adjusted in accordance with the transmit adjust code input from the digital part 100D via the terminal 201C.

The target value of the termination resistance value of the termination resistor 270 is 50Ω. The termination resistance value of the termination resistor 270 is set to the target value in the Tx termination resistor adjust mode. In the Tx termination resistor adjust mode, the selector 230 selects the constant current source 222, and the selector 240 selects the ground potential point. In the Tx termination resistor adjust mode, the selector 180A selects the terminal 202A, and the selector 180B selects a connecting part between the termination resistor 270 and the constant current source 224.

Accordingly, in the Tx termination resistor adjust mode, the comparator 190 compares a voltage drop having occurred at the reference resistor 70 and a voltage drop having occurred at the termination resistor 270. The digital part 100D adjusts the transmit adjust code so that the voltage drop of the reference resistor 70 and the voltage drop of the termination resistor 270 become equal to each other.

Therefore, the current value of the constant current source 224 connected to the termination resistor 270 in the Tx termination resistor adjust mode is set to current value (Iref×20). The current value (Iref×20) is obtained by multiplying the output current (Iref×1) of the constant current source 222 by a reciprocal ratio. The reciprocal ratio is obtained as a reciprocal number of a ratio of the target value (50Ω) of the termination resistance value of the termination resistor 270 to the resistance value (1 kΩ) of the reference resistor 70, i.e. the reciprocal number is twenty.

The first input terminal of the selector 180A is connected to the output terminal of the selector 230 and the terminal 202A. The second input terminal of the selector 180A is connected to the output terminal of the selector 240 and the terminal 202B. The output terminal of the selector 180A is connected to the non-inverted input terminal of the comparator 190.

The selection signal (Iref, Rx Term or Tx Term) is input to the selection signal input terminal of the selector 180A from the digital part 100D via the terminal 201E. The selector 180A selects the terminal 202A in a case where the selection signal Iref is input to the selection signal input terminal.

The selector 180A selects the terminal 202A in a case where the selection signal Rx Term is input to the selection signal input terminal. The selector 180A selects the terminal 202A in a case where the selection signal Tx Term is input to the selection signal input terminal.

A reference voltage Vref2 is input to one of the three input terminals of the selector 180B. Another one of the three input terminals of the selector 180B is connected to a connecting part between the termination resistor 260 and the constant current source 223. Yet another one of the three input terminals of the selector 180B is connected to a connecting part between the termination resistor 270 and the constant current source 224. The output terminal of the selector 180B is connected to the inverted input terminal of the comparator 190.

The selection signal (Iref, Rx Term or Tx Term) is input to the selection signal input terminal of the selector 180B from the digital part 100D via the terminal 201E. The selector 180B selects the reference voltage Vref2 in a case where the selection signal Iref is input to the selection signal input terminal.

The selector 180B selects the connecting part of the termination resistor 260 and the constant current source 223 in a case where the selection signal Rx Term is input to the selection signal input terminal. The selector 180B selects the connecting part of the termination resistor 270 and the constant current source 224 in a case where the selection signal Tx Term is input to the selection signal input terminal.

With reference to the comparator 190, the non-inverted input terminal is connected to the output terminal of the selector 180A, the inverted input terminal is connected to the output terminal of the selector 180B, and the output terminal is connected to the digital part 100D via the terminal 201D.

In the following, the termination resistor 270 according to the second embodiment is described with reference to FIG. 11. A termination resistor 90C as illustrated in FIG. 11 may be used as the termination resistor 270, for example.

Figure 11:
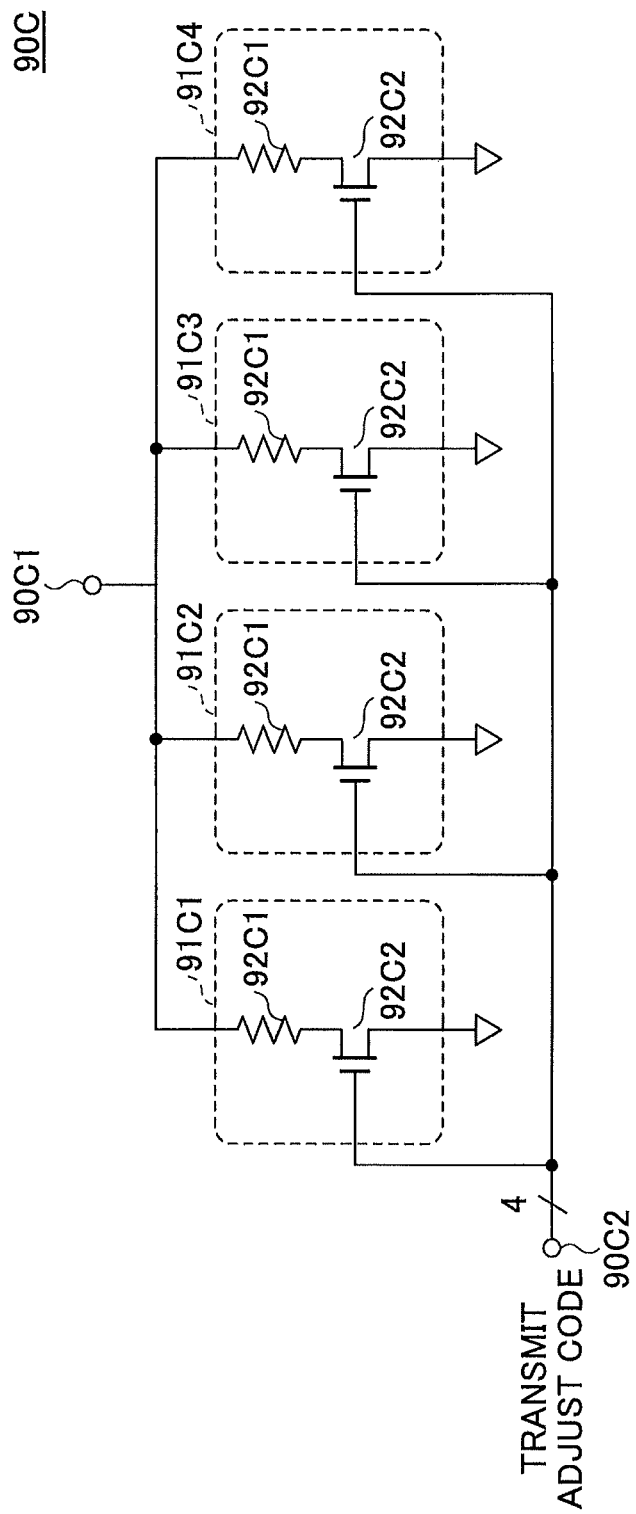
FIG. 11 is a diagram illustrating a circuit configuration of the termination resistor according to the second embodiment.

FIG. 11 is a diagram illustrating a circuit configuration of the termination resistor 90C according to the second embodiment.

The termination resistor 90C as illustrated in FIG. 11 includes terminals 90C1 and 90C2 and adjusters 91C1, 91C2, 91C3 and 91C4. The four terminals 90C2 are provided in accordance with the four adjusters 91C1, 91C2, 91C3 and 91C4, respectively.

The terminal 90C1 outputs a signal which reflects a grounded voltage VSS and a combined resistance value of the adjusters 91C1, 91C2, 91C3 and 91C4. The terminal 90C1 corresponds to a terminal located in upper side of a variable resistor of the termination resistor 270 as illustrated in FIG. 10.

The transmit adjust code is input to the terminal 90C2. The terminal 90C2 corresponds to a terminal of the termination resistor 270 to which the transmit adjust code is input. The transmit adjust code is input to a termination resistor (the variable resistor) through the terminal of the termination resistor 270.

The adjusters 91C1, 91C2, 91C3 and 91C4 have similar configurations to each other.

The adjuster 91C1 includes a resistor 92C1 and an NMOS transistor 92C2.

The resistor 92C1 is connected between the terminal 90C1 and drain of the NMOS transistor 92C2.

With regard to the NMOS transistor 92C2, the drain is connected to the resistor 92C1, a gate is connected to the terminal 90C2, and a source is connected to the ground VSS.

The adjusters 91C2, 91C3 and 91C4 have similar configurations to that of the adjuster 91C1. The resistors 92C1 of the adjusters 91C1, 91C2, 91C3 and 91C4 are connected parallel to each other with respect to the terminal 90C1. The gates of the NMOS transistors 92C2 of the adjusters 91C1, 91C2, 91C3 and 91C4 are connected to the four terminals 90C2, respectively.

In the termination resistor 90C, the NMOS transistors 92C2 of the adjusters 91C1, 91C2, 91C3 and 91C4 are turned on or off in accordance with the transmit adjust codes input to the four terminals 90C2, respectively.

As a number of the NMOS transistor 92C2 that are turned on is increased, a number of the resistors 92C1 that are connected in parallel is increased. Accordingly, the combined resistance value of the termination resistor 90C is decreased.

As a number of the NMOS transistor 92C2 that are turned on is decreased, a number of the resistors 92C1 that are connected in parallel is decreased. Accordingly, the combined resistance value of the termination resistor 90C is increased.

Each of the resistance values and sizes of the NMOS transistors 92C2 of the adjusters 91C1, 91C2, 91C3 and 91C4 may be designed so that the combined resistance value increases or decreases monotonically. A number of the adjusters (91C1, 91C2, 91C3 and 91C4) may be increased or decreased for the sake of ensuring an adjustable range of the process variance.

In the following, operations of the resistance adjusting circuit 200 in the reference current adjust mode, the Rx termination resistor adjust mode and the Tx termination resistor adjust mode are described with reference to FIGS. 12 to 14.

Figure 12:
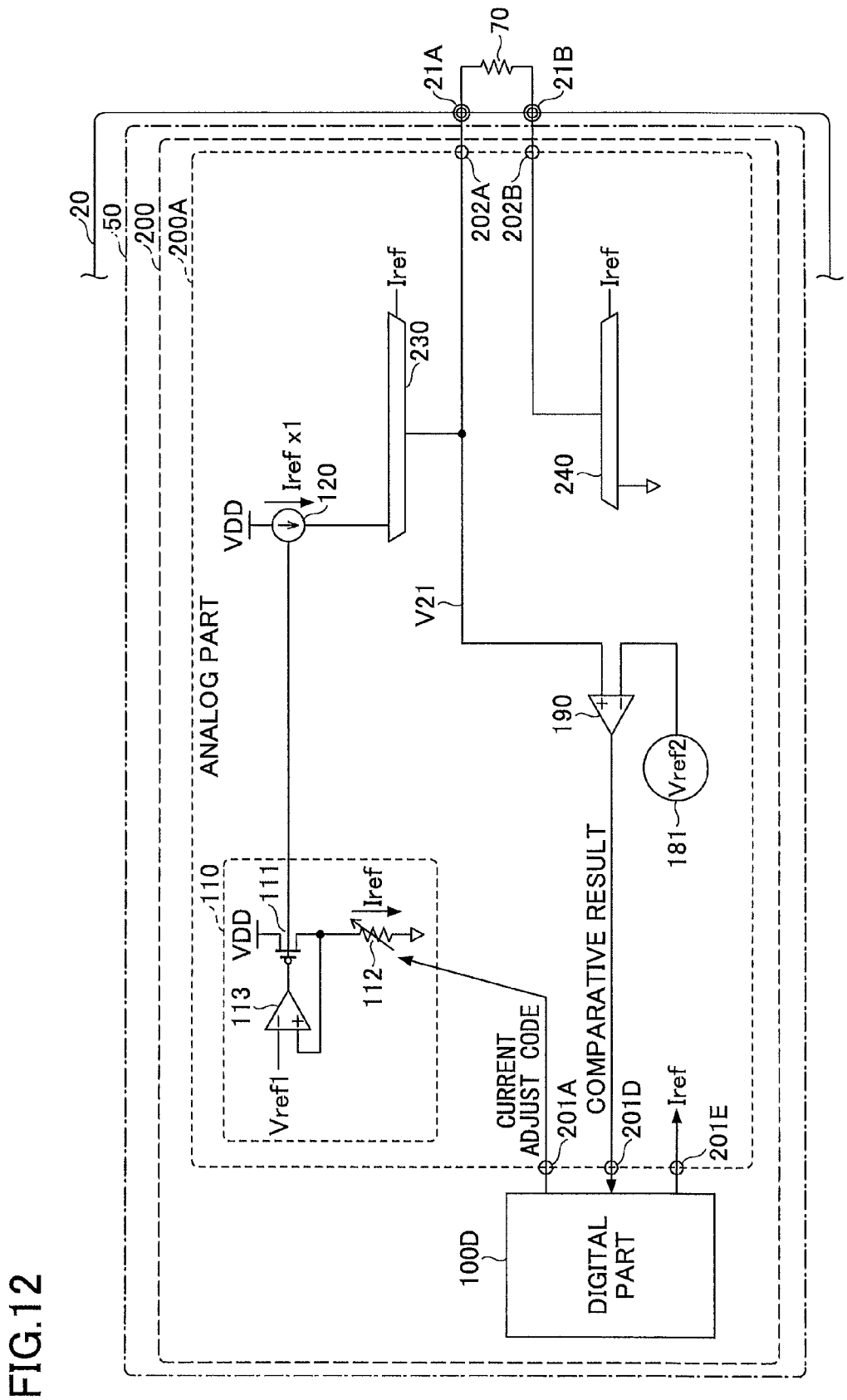
FIG. 12 is a diagram illustrating connecting relationships of the resistance adjusting circuit according to the second embodiment in the reference current adjust mode.

FIG. 12 is a diagram illustrating connecting relationships of the resistance adjusting circuit 200 according to the second embodiment in the reference current adjust mode. FIG. 13 is a diagram illustrating connecting relationships of the resistance adjusting circuit 200 according to the second embodiment in the Rx termination resistor adjust mode. FIG. 14 is a diagram illustrating connecting relationships of the resistance adjusting circuit 200 according to the second embodiment in the Tx termination resistor adjust mode.

In the reference current adjust mode, the selector 230 selects the constant current source 120, and the selector 240 selects the ground potential point in the analog part 200A as illustrated in FIG. 12. The selectors 180A and 180B (see FIG. 10) select the terminal 202A and the reference voltage Vref2, respectively.

Accordingly, in the analog part 200A, the current (Iref×1) of the constant current source 120 flows through the reference resistor 70 as illustrated in FIG. 12. As a result, a voltage V21 is generated between both ends of the reference resistor 70. The voltage V21 is given as follows: voltage V21=Iref× Rref=Iref×1 kΩ.

In this state, the comparator 190 outputs the signal representing the comparative result of the voltage V21 and the reference voltage Vref2 to the digital part 100D via the terminal 201D.

The digital part 100D adjusts the current adjust code based on the signal representing the comparative result input from the comparator 190. The current adjust code is input from the digital part 100D to the reference current generating circuit 110. By this process, the current value of the reference current Iref is adjusted.

The digital part 100D determines if the voltage V21 and the reference voltage Vref2 are equal to each other, and adjusts the current adjust code until the voltage V21 and the reference voltage Vref2 become equal to each other. The value of the ultimate current adjust code is set by these steps.

As a result, the reference current Iref which is adjusted by using the reference resistor 70 flows through the variable resistor 112 of the reference current generating circuit 110, and the constant current source 120 outputs a copy current (Iref×1) which is generated by copying the reference current Iref. Further, currents of the constant current sources 221, 222, 223 and 224 are set.

Figure 13:
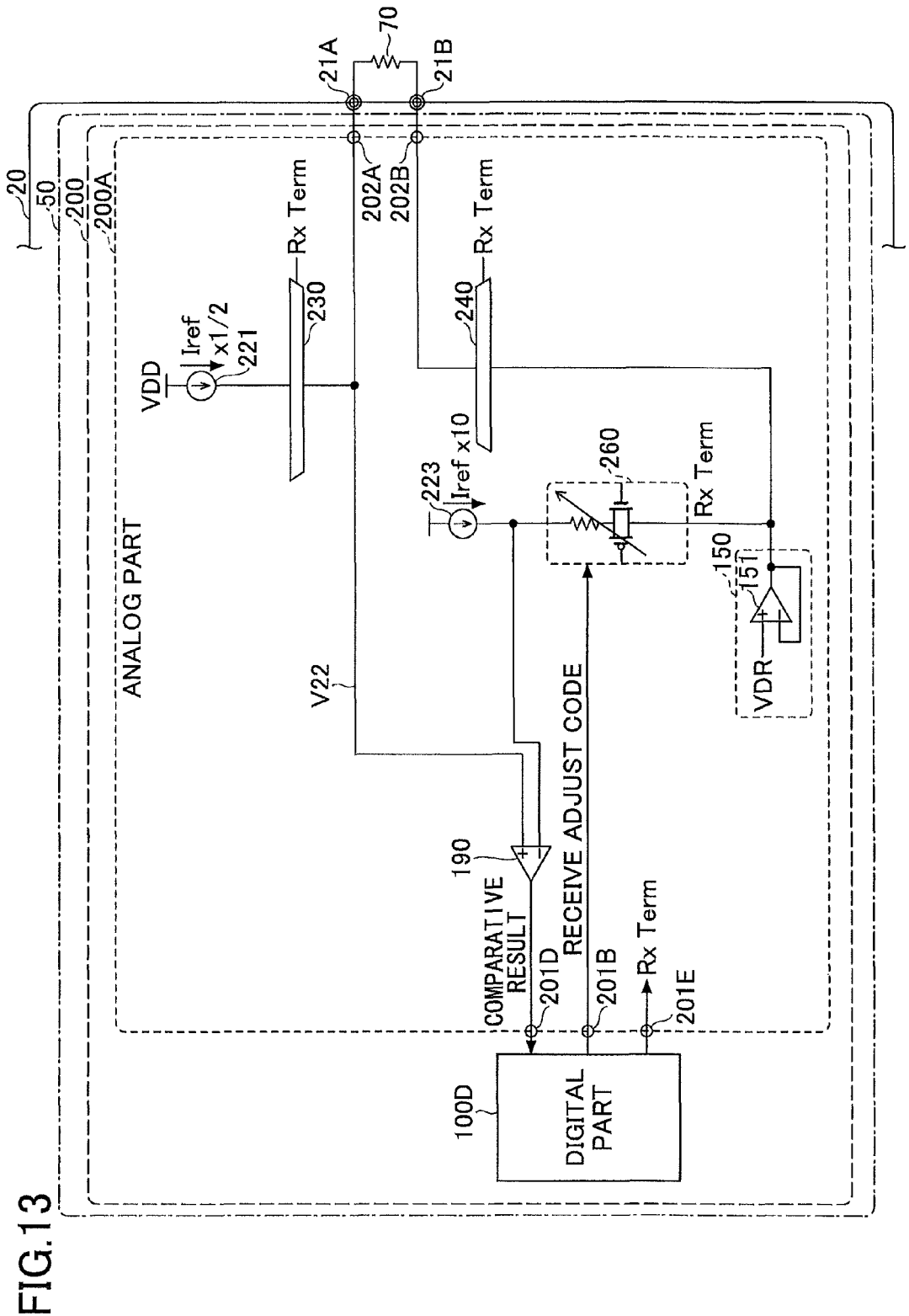
FIG. 13 is a diagram illustrating connecting relationships of the resistance adjusting circuit according to the second embodiment in the Rx termination resistor adjust mode.

In the Rx termination resistor adjust mode, the selector 230 selects the constant current source 221, and the selector 240 selects the voltage buffer 150 in the analog part 200A as illustrated in FIG. 13. Further, the selectors 180A and 180B (see FIG. 10) select the terminal 202A and the connecting part between the termination resistor 260 and the constant current source 223, respectively. The output voltage of the voltage buffer 150 is supplied to the termination resistor 260 and the reference resistor 70.

Accordingly, the current (Iref×1/2) which is output from the constant current source 221 flows through the reference resistor 70 as illustrated in FIG. 13. The current (Iref×10) which is output from the constant current source 223 flows through the termination resistor 260.

Then, the comparator 190 outputs the signal representing the comparative result of the voltage V22 at the terminal 202A and the voltage Vout_Rx at the connecting part between the termination resistor 260 and the constant current source 223 to the digital part 100D via the terminal 201D.

The digital part 100D adjusts the receive adjust code based on the signal representing the comparative result input from the comparator 190. The receive adjust code is input from the digital part 100D to the termination resistor 260. Accordingly, the resistance value of the termination resistor 260 is adjusted.

The digital part 100D determines if the voltage V22 at the terminal 202A and the voltage Vout_Rx at the connecting part between the termination resistor 260 and the constant current source 223 are equal to each other, and adjusts the receive adjust code until the voltage V22 of the terminal 202A and the voltage Vout_Rx become equal to each other. The value of the ultimate receive adjust code is set by these steps.

If the digital part 100D determines that the voltage V22 is equal to the voltage Vout_Rx, the digital part 100D ends the Rx termination resistor adjust mode.

Herein, the voltage V22 at the terminal 202A and the voltage Vout_Rx at the connecting part between the termination resistor 260 and the constant current source 223 are calculated as follows. The termination resistance value of the termination resistor 260 is referred to as RRx.

The voltage V22 at the terminal 202A is given as follows: V$22$=VDR+Rref×(Iref×1/2). The voltage Vout_Rx at the connecting part between the termination resistor 260 and the constant current source 223 is given as follows: Vout_Rx=VDR+RRx×Iref×10. Accordingly, the digital part 100D sets the termination resistance value RRx of the termination resistor 260 by adjusting the receive adjust code so that the voltage V22 at the terminal 202A becomes equal to the voltage Vout_Rx at the connecting part between the termination resistor 260 and the constant current source 223.

In other words, in the Rx termination resistor adjust mode, the comparator 190 compares the voltage drop having occurred at the reference resistor 70 and the voltage drop having occurred at the termination resistor 260. The digital part 100D adjusts the receive adjust code so that the voltage drop of the reference resistor 70 and the voltage drop of the termination resistor 260 become equal to each other.

Since the output current (Iref×10) of the constant current source 223 is twenty times greater than the output current (Iref×1/2) of the constant current source 221, the termination resistance value RRx of the termination resistor 260 is set to 50Ω which is obtained by multiplying resistance value Rref (1 kΩ) of the reference resistor 70 by a reciprocal ratio. The reciprocal ratio is obtained as a reciprocal number of a ratio of the output current (Iref×10) and the output current (Iref×1/2). The reciprocal number is twenty. This is the target value of the termination resistance value RRx of the termination resistor 260.

As a result of the processes of the Rx termination resistor adjust mode, the termination resistance value RRx of the termination resistor 260 is set to the target value, i.e. 50 Ω.

Figure 14:
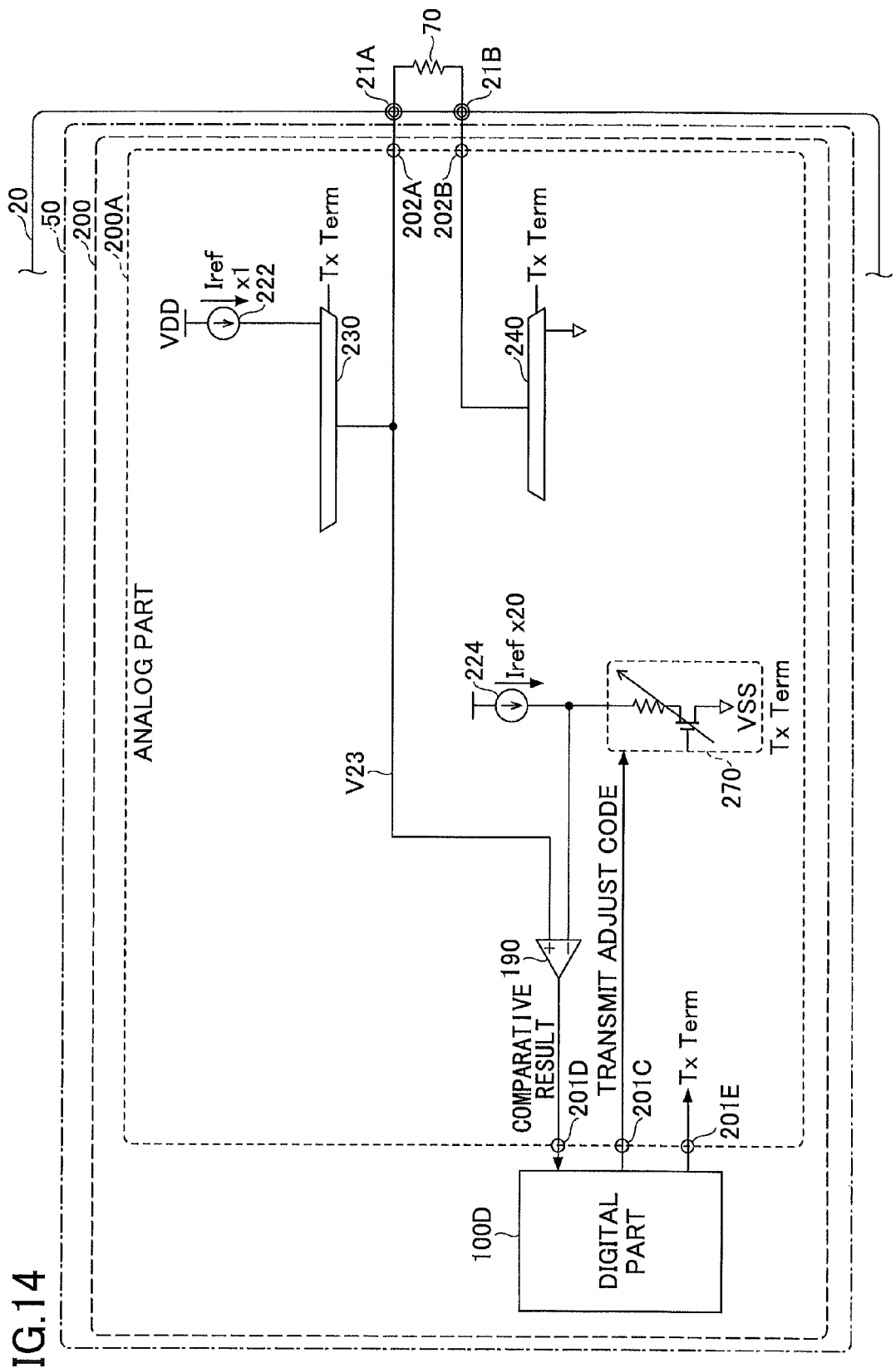
FIG. 14 is a diagram illustrating connecting relationships of the resistance adjusting circuit according to the second embodiment in the Tx termination resistor adjust mode.

In the Tx termination resistor adjust mode, the selector 230 selects the constant current source 222, and the selector 240 selects the ground potential point in the analog part 200A as illustrated in FIG. 14. Further, the selectors 180A and 180B (see FIG. 10) select the terminal 202A and the connecting part between the termination resistor 270 and the constant current source 224, respectively.

Accordingly, the current (Iref×1) which is output from the constant current source 222 flows through the reference resistor 70 as illustrated in FIG. 14. The current (Iref×20) which is output from the constant current source 224 flows through the termination resistor 270.

Then, the comparator 190 outputs the signal representing the comparative result of the voltage V23 at the terminal 202A and the voltage Vout_Tx at the connecting part between the termination resistor 270 and the constant current source 224 to the digital part 100D via the terminal 201D.

The digital part 100D adjusts the transmit adjust code based on the signal representing the comparative result input from the comparator 190. The transmit adjust code is input from the digital part 100D to the termination resistor 270. Accordingly, the resistance value of the termination resistor 270 is adjusted.

The digital part 100D determines if the voltage V23 at the terminal 202A and the voltage Vout_Tx at the connecting part between the termination resistor 270 and the constant current source 224 are equal to each other, and adjusts the receive adjust code until the voltage V23 of the terminal 202A and the voltage Vout_Tx become equal to each other. The value of the ultimate transmit adjust code is set by these steps.

If the digital part 100D determines that the voltage V23 is equal to the voltage Vout_Tx, the digital part 100D ends the Tx termination resistor adjust mode.

Herein, the voltage V23 at the terminal 202A and the voltage Vout_Tx at the connecting part between the termination resistor 270 and the constant current source 224 are calculated as follows. The termination resistance value of the termination resistor 270 is referred to as RTx.

The voltage V23 at the terminal 202A is given as follows: V$23$=Rref×(Iref×1). The voltage Vout_Tx at the connecting part between the termination resistor 270 and the constant current source 224 is given as follows: Vout_Tx=RTx×Irefx 20. Accordingly, the digital part 100D sets the termination resistance value RTx of the termination resistor 270 by adjusting the transmit adjust code so that the voltage V23 at the terminal 202A becomes equal to the voltage Vout_Tx at the connecting part between the termination resistor 270 and the constant current source 224.

In other words, in the Tx termination resistor adjust mode, the comparator 190 compares a voltage drop having occurred at the reference resistor 70 and a voltage drop having occurred at the termination resistor 270. The digital part 100D adjusts the transmit adjust code so that the voltage drop of the reference resistor 70 and the voltage drop of the termination resistor 270 become equal to each other.

Since the output current (Iref×20) of the constant current source 224 is twenty times greater than the output current (Iref×1) of the constant current source 222, the termination resistance value RTx of the termination resistor 270 is set to 50Ω which is obtained by multiplying resistance value Rref (1 kΩ) of the reference resistor 70 by a reciprocal ratio. The reciprocal ratio is obtained as a reciprocal number of a ratio of the output current (Iref×20) and the output current (Iref×1). The reciprocal number is twenty. This is the target value of the termination resistance value RTx of the termination resistor 270.

As a result of the processes of the Tx termination resistor adjust mode, the termination resistance value RTx of the termination resistor 270 is set to the target value, i.e. 50 Ω.

The resistance adjusting circuit 200 uses the constant current sources 221 and 223, the reference resistor 70 and the voltage buffer 150 in the Rx termination resistor adjust mode. The constant current sources 221 and 223 output currents based on the reference current of the reference current generating circuit 110. Accordingly, it is possible to set the termination resistance value RRx of the termination resistor 260 to the target value, i.e. 50 Ω with high accuracy.

Therefore, according to the second embodiment, it is possible to provide the resistance adjusting circuit 200 and the resistance adjusting method that can set the termination resistance value at an Rx circuit such as the termination resistor 260 with high accuracy in a manner similar to that of the first embodiment.

Further, according to the second embodiment, it is possible to provide the resistance adjusting circuit 200 and the resistance adjusting method that can set the termination resistance value at a Tx circuit such as the termination resistor 270 with high accuracy in a manner similar to that of the first embodiment.

According to the resistance adjusting circuit 200 of the second embodiment, it is possible to set the reference current in the reference current adjust mode and to set the termination resistance value of the Rx circuit in the Rx termination resistor adjust mode by using one reference resistor 70.

According to the second embodiment, it is possible to reduce manufacturing cost of the resistance adjusting circuit 200.

According to the resistance adjusting circuit 200 of the second embodiment, it is possible to set the termination resistance value to the target value (50Ω) of the Rx circuit to which the arbitrary termination voltage VDR is supplied by using the constant current sources 221 and 223, the reference resistor 70 and the voltage buffer 150. The constant current sources 221 and 223 output the currents based on the reference current of the reference current generating circuit 110. Therefore, it is possible to receive high quality data in the resistance adjusting circuit 200.

According to an aspect of the above-described embodiments, there is provided the resistance adjusting circuit and the resistance adjusting method that can adjust resistance value in accordance with an arbitrary termination voltage at a receive (Rx) side.

So far, the preferred embodiments and modification of the resistance adjusting circuit and the resistance adjusting method are described. However, the invention is not limited to those specifically described embodiments and the modification thereof, and various modifications and alterations may be made within the scope of the inventions described in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention.

Although the embodiments of the present invention have been described in detail, it should be understood that the various changes, substitutions, and alterations could be made hereto without departing from the spirit and scope of the invention.

What is claimed is:

1. A resistance adjusting circuit comprising:
    a reference resistor;
    a first power source connected to a first terminal of the reference resistor and configured to output a first voltage;
    a first current source connected to a second terminal of the reference resistor and configured to output a first current based on a reference current which is set by using the reference resistor;
    a first variable resistor configured to include a first terminal, the first terminal being connected to an output terminal of the first power source;
    a second current source connected to a second terminal of the first variable resistor and configured to output a second current obtained by multiplying the first current by a reciprocal ratio, the reciprocal ratio being obtained as a reciprocal number of a ratio of a target resistance value of the first variable resistor to a resistance value of the reference resistor; and
    a controller configured to set the resistance value of the first variable resistor so that a voltage value at the second terminal of the reference resistor and a voltage value at a connecting part of the first variable resistor and the second current source become equal to each other.

2. The resistance adjusting circuit as claimed in claim 1 further comprising:
    a first selector configured to include a first input terminal, a second input terminal and an output terminal and to select the first input terminal or the second input terminal, the output terminal being connected to the first terminal of the reference resistor;
    a second selector configured to include a first input terminal, a second input terminal and an output terminal and to select the first input terminal or the second input terminal, the output terminal being connected to the second terminal of the reference resistor, and the first input terminal being connected to a reference potential point; and
    a reference current output circuit configured to include an output terminal connected to the first input terminal of the first selector and to output the reference current;

wherein the first power source is connected to the second input terminal of the first selector and is connected to the first terminal of the reference resistor via the first selector, wherein the first current source is connected to the second input terminal of the second selector and is connected to the second terminal of the reference resistor via the second selector, wherein the second current source is connected between the second terminal of the first variable resistor and a reference potential point, wherein, when setting the reference current, the controller adjusts the reference current of the reference current output circuit so that a voltage value at the first terminal of the reference resistor and a target voltage value at the first terminal of the reference resistor become equal to each other, in a state where the controller causes the first selector to select the first input terminal and causes the second selector to select the first input terminal, and wherein, after setting the reference current, the controller adjusts the resistance value of the first variable resistor so that the voltage value at the second terminal of the reference resistor and the voltage value at the connecting part of the first variable resistor and the second current source become equal to each other in a case where the controller causes the first selector to select the second input terminal and causes the second selector to select the second input terminal.

3. The resistance adjusting circuit as claimed in claim 2 further comprising:

a third selector configured to include two input terminals connected to the first terminal and the second terminal of the reference resistor, respectively;

a fourth selector configured to include two input terminals connected to the connecting part of the first variable resistor and the second current source and to the second power source which outputs the target voltage value at the first terminal of the reference resistor, respectively; and a comparing part configured to compare an output of the third selector and an output of the fourth selector;

wherein, when setting the reference current, the controller adjusts the reference current based on a comparative result of the comparing part so that the voltage value at the first terminal of the reference resistor and the target voltage value at the first terminal of the reference resistor become equal to each other in a case where the controller causes the third selector to select the input terminal connected to the first terminal of the reference resistor and to causes the fourth selector to select the input terminal connected to the second power source which outputs the target voltage value, and wherein the controller, after setting the reference current, adjusts the resistance value of the first variable resistor based on a comparative result of the comparing part so that the voltage value at the second terminal of the reference resistor and the voltage value at the connecting part of the first variable resistor and the second current source become equal to each other in a state where the controller causes the third selector to select the input terminal connected to the second terminal of the reference resistor and causes the fourth selector to select the input terminal connected to the connecting part of the first variable resistor and the second current source.

4. The resistance adjusting circuit as claimed in claim 2 further comprising:

a third current source configured to include a current input terminal and to output a third current based on the reference current, the current input terminal being connected to a third input terminal of the second selector;

a second variable resistor configured to include a first terminal connected to a power source; and a fourth current source connected to a second terminal of the second variable resistor and configured to output a fourth current, the fourth current being obtained by multiplying the first current by a reciprocal ratio, the reciprocal ratio being obtained as a reciprocal number of a ratio of a target resistance value of the second variable resistor to a resistance value of the reference resistor;

wherein the first selector further includes a third input terminal connected to a power source, wherein the second selector further includes a third input terminal connected to the third current source, and wherein the controller, after setting the reference current, adjusts the resistance value of the second variable resistor so that the voltage value at the second terminal of the reference resistor and a voltage value at a connecting part of the second variable resistor and the fourth current source become equal to each other, in a case where the controller causes the first selector to select the third input terminal and causes the second selector to select the third input terminal.

5. The resistance adjusting circuit as claimed in claim 3 further comprising:

a third current source configured to include a current input terminal and to output a third current based on the reference current, the current input terminal being connected to a third input terminal of the second selector;

a second variable resistor configured to include a first terminal connected to a power source; and a fourth current source connected to a second terminal of the second variable resistor and configured to output a fourth current, the fourth current being obtained by multiplying the first current by a reciprocal ratio, the reciprocal ratio being obtained as a reciprocal number of a ratio of a target resistance value of the second variable resistor to a resistance value of the reference resistor;

wherein the first selector further includes a third input terminal connected to a power source, wherein the second selector further includes a third input terminal connected to the third current source, and wherein the controller, after setting the reference current, adjusts the resistance value of the second variable resistor so that the voltage value at the second terminal of the reference resistor and a voltage value at a connecting part of the second variable resistor and the fourth current source become equal to each other, in a case where the controller causes the first selector to select the third input terminal and causes the second selector to select the third input terminal.

6. The resistance adjusting circuit as claimed in claim 3 further comprising:

a third current source configured to include a current input terminal and to output a third current based on the reference current, the current input terminal being connected to a third input terminal of the second selector;

a second variable resistor configured to include a first terminal connected to a power source; and a fourth current source connected to a second terminal of the second variable resistor and configured to output a fourth current, the fourth current being obtained by multiplying the first current by a reciprocal ratio, the reciprocal ratio being obtained as a reciprocal number of a ratio of a target resistance value of the second variable resistor to a resistance value of the reference resistor;
wherein the first selector further includes a third input terminal of a power source
wherein the second selector further includes a third input terminal connected to the third current source,
wherein the fourth selector further includes an input terminal connected to the connecting part of the second variable resistor and the fourth current source, and
wherein the controller, after setting the reference current, adjusts the resistance value of the second variable resistor so that the voltage value at the second terminal of the reference resistor and a voltage value at a connecting part of the second variable resistor and the fourth current source become equal to each other, in a state where the controller causes the first selector to select the third input terminal, causes the second selector to select the third input terminal, causes the third selector to select the input terminal connected to the second terminal of the reference resistor, and causes the fourth selector to select the input terminal connected to the connecting part of the second variable resistor and the fourth current source.

7. The resistance adjusting circuit as claimed in claim 1 further comprising:
a first selector configured to include a first input terminal, a second input terminal and an output terminal and to select the first input terminal or the second input terminal, the output terminal being connected to the second terminal of the reference resistor;
a second selector configured to include a first input terminal, a second input terminal and an output terminal and to select the first input terminal or the second input terminal, the output terminal being connected to the first terminal of the reference resistor, and the first input terminal being connected to a reference potential point; and
a reference current output circuit configured to include an output terminal connected to the first input terminal of the first selector and to output the reference current;
wherein the first power source is connected to the second input terminal of the second selector and is connected to the first terminal of the reference resistor via the second selector,
wherein the first current source is connected to the second input terminal of the first selector, and is connected to the second terminal of the reference resistor via the first selector,
wherein the second current source is connected between the second terminal of the first variable resistor and a power source,
wherein, when setting the reference current, the controller adjusts the reference current of the reference current output circuit so that the voltage value at the second terminal of the reference resistor and a target voltage value at the second terminal of the reference resistor become equal to each other, in a state where the controller causes the first selector to select the first input terminal and causes the second selector to select the first input terminal, and
wherein, after setting the reference current, the controller adjusts the resistance value of the first variable resistor so that a voltage value at the second terminal of the reference resistor and a voltage value at a connecting part of the first variable resistor and the second current source become equal to each other, in a state where the controller causes the first selector to select the second input terminal and causes the second selector to select the second input terminal.

8. The resistance adjusting circuit as claimed in claim 7 further comprising:
a third selector configured to include two input terminals connected to the first terminal of the reference resistor and the second terminal, respectively;
a fourth selector configured to include two input terminals connected to the connecting part of the first variable resistor and the second current source and a second power source which outputs the target voltage value at the second terminal of the reference resistor, respectively; and
a comparing part configured to compare an output of the third selector and an output of the fourth selector,
wherein, when setting the reference current, the controller adjusts the reference current of the reference current output circuit based on a comparative result of the comparing part so that a voltage value at the second terminal of the reference resistor and a target voltage value at the second terminal of the reference resistor become equal to each other, in a state where the controller causes the third selector to select the input terminal connected to the second terminal of the reference resistor and causes the fourth selector to select an input terminal connected to the second power source which outputs the target voltage value, and
wherein, after setting the reference current, the controller adjusts the resistance value of the first variable resistor based on a comparative result of the comparing part so that a voltage value at the second terminal of the reference resistor and a voltage value at a connecting part of the first variable resistor and the second current source become equal to each other, in a state where the controller causes the third selector to select the input terminal connected to the second terminal of the reference resistor and causes the fourth selector to select an input terminal connected to the connecting part of the first variable resistor and the second current source.

9. The resistance adjusting circuit as claimed in claim 8 further comprising:
a third current source configured to include a current input terminal connected to the third input terminal of the first selector and to output a third current based on the reference current;
a second variable resistor configured to include a second variable resistor connected to a reference potential point; and
a fourth current source connected to the second terminal of the second variable resistor and configured to output a fourth current, the fourth current being obtained by multiplying the first current by a reciprocal ratio, the reciprocal ratio being obtained as a reciprocal number of a ratio of a target resistance value of the second variable resistor to a resistance value of the reference resistor;
wherein the first selector further includes a third input terminal connected to the third current source,
wherein the second selector further includes a third input terminal connected to a power source, and
wherein, after setting the reference current, the controller adjusts a resistance value of the second variable resistor so that the voltage value at the second terminal of the reference resistor and a voltage value at a connecting part of the second variable resistor and the fourth current source become equal to each other, in a state where the controller causes the first selector to select the third input terminal and causes the second selector to select the third input terminal.

10. The resistance adjusting circuit as claimed in claim 8 further comprising:
a third current source configured to include a current input terminal connected to the third input terminal of the first selector and to output a third current based on the reference current;
a second variable resistor configured to include a first terminal connected to a reference potential point; and
a fourth current source connected to the second terminal of the second variable resistor and configured to output a fourth current, the fourth current being obtained by multiplying the first current by a reciprocal ratio, the reciprocal ratio being obtained as a reciprocal number of a ratio of a target resistance value of the second variable resistor to a resistance value of the reference resistor;
wherein the first selector further includes a third input terminal connected to the third current source,
wherein the second selector further includes a third input terminal connected to a reference potential point,
wherein the fourth selector further includes an input terminal connected to the connecting part of the second variable resistor and fourth current source, and
wherein, after setting the reference current, the controller adjusts the resistance value of the second variable resistor so that the voltage value at the second terminal of the reference resistor and a voltage value at a connecting part of the second variable resistor and the fourth current source become equal to each other, in a state where the controller causes the first selector to select the third input terminal, causes the second selector to select the third input terminal, causes the third selector to select the input terminal connected to the second terminal of the reference resistor, and causes the fourth selector to select the input terminal connected to the connecting part of the second variable resistor and the fourth current source.

11. The resistance adjusting circuit as claimed in claim 7 further comprising:
a third current source configured to include a current input terminal connected to the third input terminal of the first selector and to output a third current based on the reference current;
a second variable resistor configured to include a second variable resistor connected to a reference potential point; and
a fourth current source connected to the second terminal of the second variable resistor and configured to output a fourth current, the fourth current being obtained by multiplying the first current by a reciprocal ratio, the reciprocal ratio being obtained as a reciprocal number of a ratio of a target resistance value of the second variable resistor to a resistance value of the reference resistor;
wherein the first selector further includes a third input terminal connected to the third current source,
wherein the second selector further includes a third input terminal connected to a power source, and
wherein, after setting the reference current, the controller adjusts a resistance value of the second variable resistor so that the voltage value at the second terminal of the reference resistor and a voltage value at a connecting part of the second variable resistor and the fourth current source become equal to each other, in a state where the controller causes the first selector to select the third input terminal and causes the second selector to select the third input terminal.

12. The resistance adjusting circuit as claimed in claim 1, wherein the reference resistor is disposed outside of an LSI chip.

13. A resistance adjusting circuit comprising:
a reference resistor;
a first selector configured to include a first input terminal, a second input terminal and an output terminal and to select the first input terminal or the second input terminal, the output terminal being connected to the first terminal of the reference resistor;
a second selector configured to include a first input terminal, a second input terminal and an output terminal and to select the first input terminal or the second input terminal, the output terminal being connected to the second terminal of the reference resistor and the first input terminal being connected to a reference potential point;
a reference current output circuit configured to include an output terminal connected to the first input terminal of the first selector and to output the reference current;
a first power source configured to include an output terminal connected to the second input terminal of the first selector and to output a first voltage;
a first current source connected to the second input terminal of the second selector and configured to output a first current based on the reference current;
a variable resistor configured to include a first terminal connected to the output terminal of the first power source;
a second current source connected to a second terminal of the variable resistor and configured to output a second current, the second current being obtained by multiplying the first current by a reciprocal ratio, the reciprocal ratio being obtained as a reciprocal number of a ratio of a target resistance value of the variable resistor to a resistance value of the reference resistor; and
a controller;
wherein, when setting the reference current, the controller adjusts the reference current of the reference current output circuit so that a voltage value at a first terminal of the reference resistor and a target voltage value at the first terminal of the reference resistor become equal to each other, in a state where the controller causes the first selector to select the first input terminal and causes the second selector to select the first input terminal, and
wherein, after setting the reference current, the controller adjusts a resistance value of the variable resistor so that a voltage value at the second terminal of the reference resistor and a voltage value at a connecting part of the variable resistor and the second current source become equal to each other, in a state where the controller causes the first selector to select the second input terminal and causes the second selector to select the second input terminal.

14. A resistance adjusting method comprising:
using a resistance adjusting circuit including,
a reference resistor;
a first selector configured to include a first input terminal, a second input terminal and an output terminal and to select the first input terminal or the second input terminal, the output terminal being connected to the first terminal of the reference resistor;
a second selector configured to include a first input terminal, a second input terminal and an output terminal and to select the first input terminal or the second input terminal, the output terminal being connected to the second terminal of the reference resistor and the first input terminal being connected to a reference potential point;

a reference current output circuit configured to include an output terminal connected to the first input terminal of the first selector and to output the reference current;

a first power source configured to include an output terminal connected to the second input terminal of the first selector and to output a first voltage;

a first current source connected to the second input terminal of the second selector and configured to output a first current based on the reference current;

a variable resistor configured to include a first terminal connected to the output terminal of the first power source; and a second current source connected to a second terminal of the variable resistor and configured to output a second current, the second current being obtained by multiplying the first current by a reciprocal ratio, the reciprocal ratio being obtained as a reciprocal number of a ratio of a target resistance value of the variable resistor to a resistance value of the reference resistor;

adjusting, when setting the reference current, the reference current of the reference current output circuit so that a voltage value at a first terminal of the reference resistor and a target voltage value at the first terminal of the reference resistor become equal to each other, in a state where the first selector selects the first input terminal and the second selector selects the first input terminal; and adjusting, after setting the reference current, a resistance value of the variable resistor so that a voltage value at a second terminal of the reference resistor and a voltage value at a connecting part of the variable resistor and the second current source become equal to each other, in a state where the first selector selects the second input terminal and the second selector selects the second input terminal.

* * * * *

UNITED STATES PATENT AND TRADEMARK OFFICE
CERTIFICATE OF CORRECTION

| | | |
|---|---|---|
| PATENT NO. | : 9,048,814 B2 | Page 1 of 1 |
| APPLICATION NO. | : 14/282260 | |
| DATED | : June 2, 2015 | |
| INVENTOR(S) | : Naoya Shibayama et al. | |

It is certified that error appears in the above-identified patent and that said Letters Patent is hereby corrected as shown below:

On the Title Page

Column 1, Item [73] (Assignees), Line 1, delete "FJUITSU" and insert -- FUJITSU --, therefor.

Signed and Sealed this
Eighth Day of September, 2015

Michelle K. Lee
*Director of the United States Patent and Trademark Office*